US006762481B2

(12) United States Patent
Liu et al.

(10) Patent No.: US 6,762,481 B2
(45) Date of Patent: Jul. 13, 2004

(54) ELECTRICALLY PROGRAMMABLE NONVOLATILE VARIABLE CAPACITOR

(75) Inventors: Shangqing Liu, Houston, TX (US); Naijuan Wu, Houston, TX (US); Alex Ignatiev, Houston, TX (US); JainRen Li, Houston, TX (US)

(73) Assignee: The University of Houston System, Houston, TX (US)

( * ) Notice: Subject to any disclaimer, the term of this patent is extended or adjusted under 35 U.S.C. 154(b) by 0 days.

(21) Appl. No.: 10/267,010

(22) Filed: Oct. 8, 2002

(65) Prior Publication Data

US 2004/0065912 A1 Apr. 8, 2004

(51) Int. Cl.⁷ .............................................. H01L 29/93
(52) U.S. Cl. ..................................... 257/595; 257/312
(58) Field of Search ................................. 257/595, 312

(56) References Cited

U.S. PATENT DOCUMENTS

| | | | |
|---|---|---|---|
| 4,449,141 A | | 5/1984 | Sato et al. |
| 4,529,995 A | | 7/1985 | Sakai et al. |
| 5,512,514 A | | 4/1996 | Lee |
| 5,519,235 A | * | 5/1996 | Ramesh ...................... 257/295 |
| 5,972,430 A | * | 10/1999 | DiMeo et al. ........... 427/255.32 |
| 6,204,139 B1 | * | 3/2001 | Liu et al. ..................... 438/385 |
| 6,377,440 B1 | * | 4/2002 | Zhu et al. .................... 361/311 |
| 6,441,671 B1 | * | 8/2002 | Rastegar ..................... 327/337 |
| 6,473,332 B1 | * | 10/2002 | Ignatiev et al. .............. 365/148 |
| 6,654,210 B2 | * | 11/2003 | Pan et al. .................... 360/324 |

OTHER PUBLICATIONS

Electronic Devices and Circuit Theory, Boylestad and Louis Nashelsky. Prentice Hal, Chapter 20. Seventh Edition (Year is Unknown).

JPN J. Appl. Phys. vol. 32 (1993) pp. 442–446.

Science, vol. 264 Apr. 15, 1994. Thousandfold Change In Resitivity in Magnetoresistive La–CA–Mn–O Films.

Howes. Variable Impedance Devices. Wiley Publication. pp19–21 (Date is unknown).

Mortenson, Kenneth E. Variable Capacitance Diodes. Chapter 3 Small Signal Characteristics; pp. 28–41. 1974.

Applied Physics Letters, vol. 76, No. 19, May 2000. Liu, Wu, and Ignatiev. Electric–Pulse–Induced Reversible Resistance Change Effect in Magnetoresistive Films, pp. 2749–2751.

JPL Publication 01–15, Proceedings Non–Volatile Memory Technology Symposium 2001. Nov. 7–8, 2001. Liu, Wu, and Ignatiev. A New Concept for Non–Volatile Memory: The Electric–Puls Induced Resistive Change Effect in Colossal Magnetoresistive Thin Films.

* cited by examiner

*Primary Examiner*—David Nelms
*Assistant Examiner*—Tu-Tu Ho
(74) *Attorney, Agent, or Firm*—Robert W Strozier

(57) ABSTRACT

A basic form of a variable capacitive apparatus and its actuating method are disclosed. The apparatus is a simple two-terminal structure and may be set by short duration, low voltage electrical pulses. Materials with perovskite structure or perovskite-related structures, especially colossal magnetoresistive materials, are the active constituents of the apparatus. The apparatus overcomes the shortcomings of its predecessors and offers the advantages of non-volatility, two or multi-level storage, non-destructive reading, free-of-power maintenance and potential high radiation hardness.

30 Claims, 16 Drawing Sheets

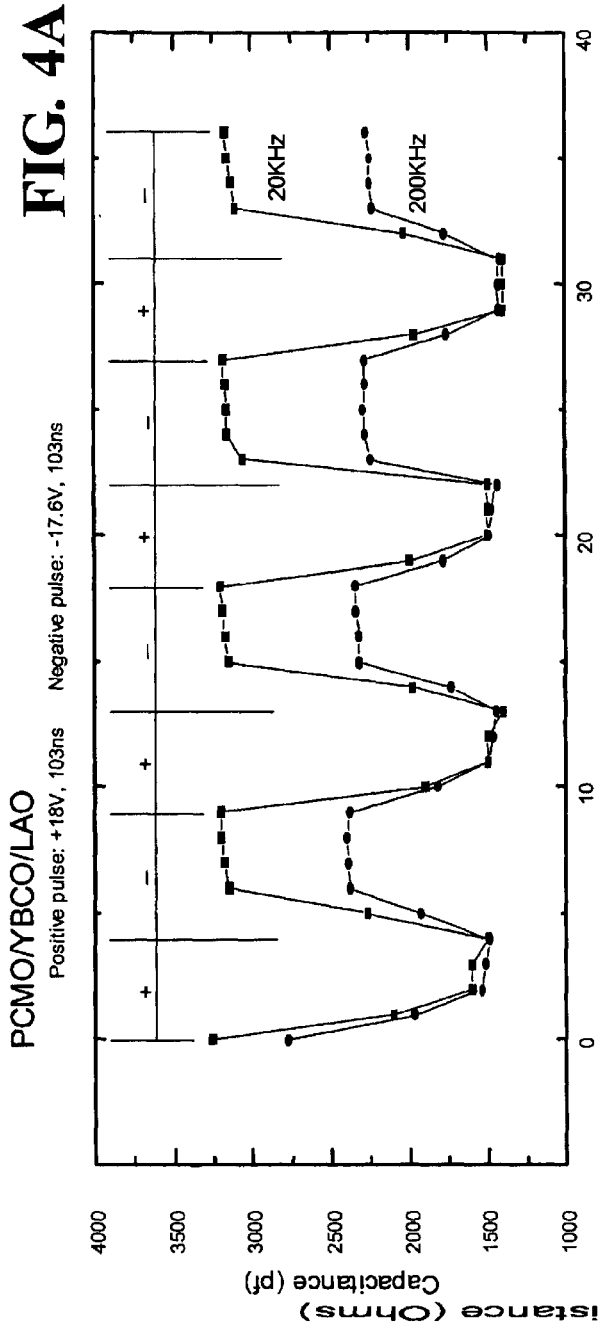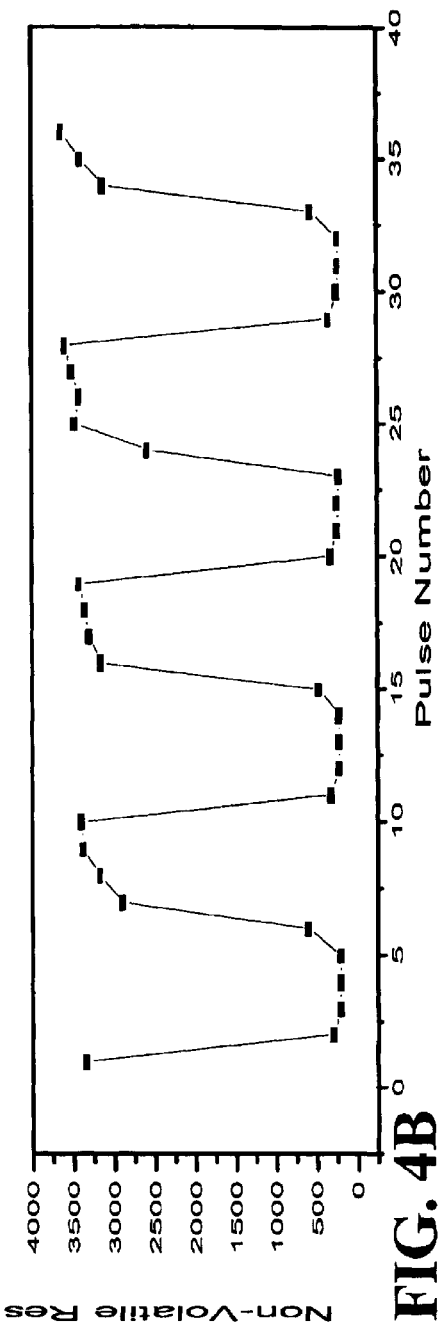

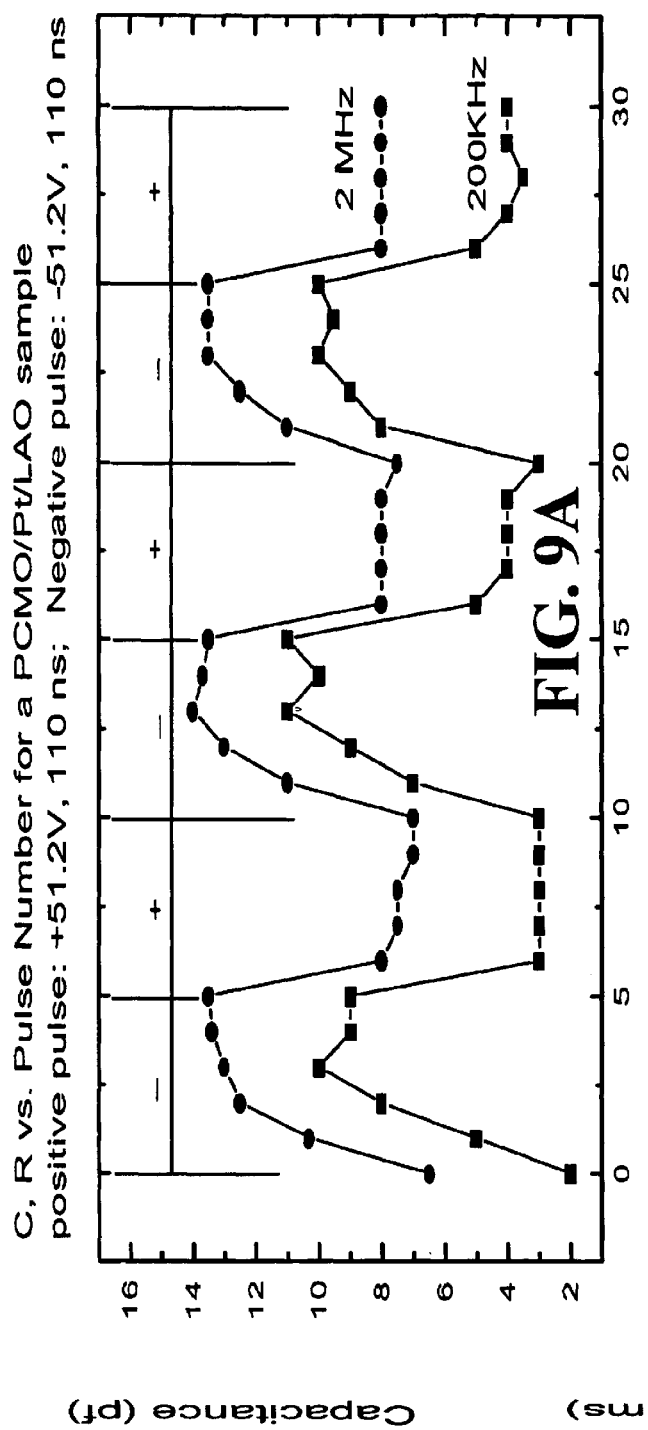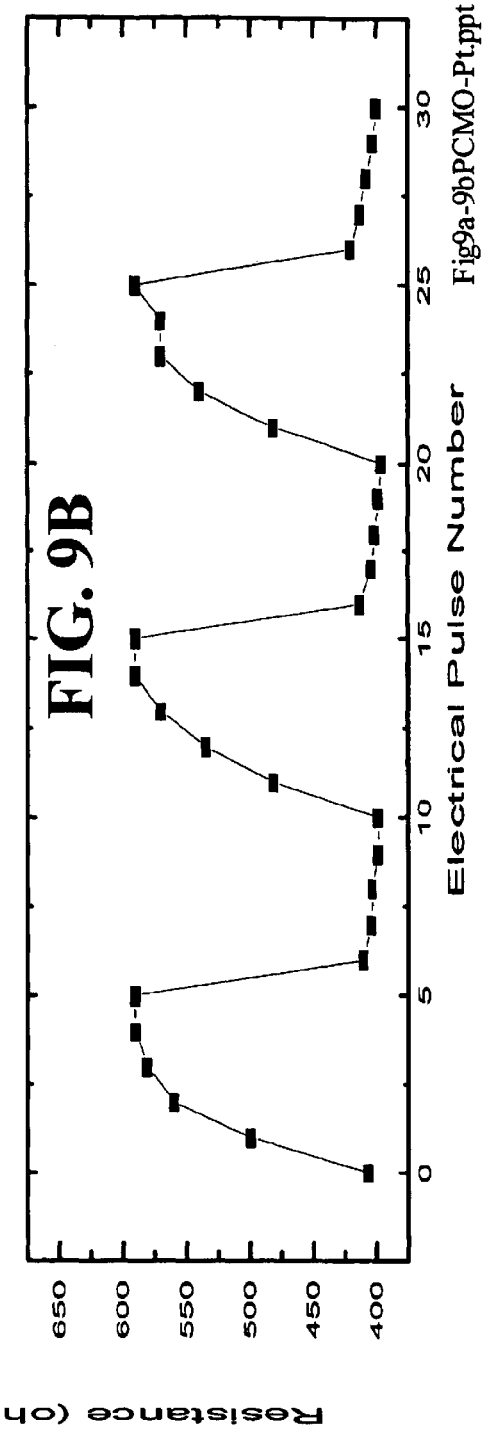

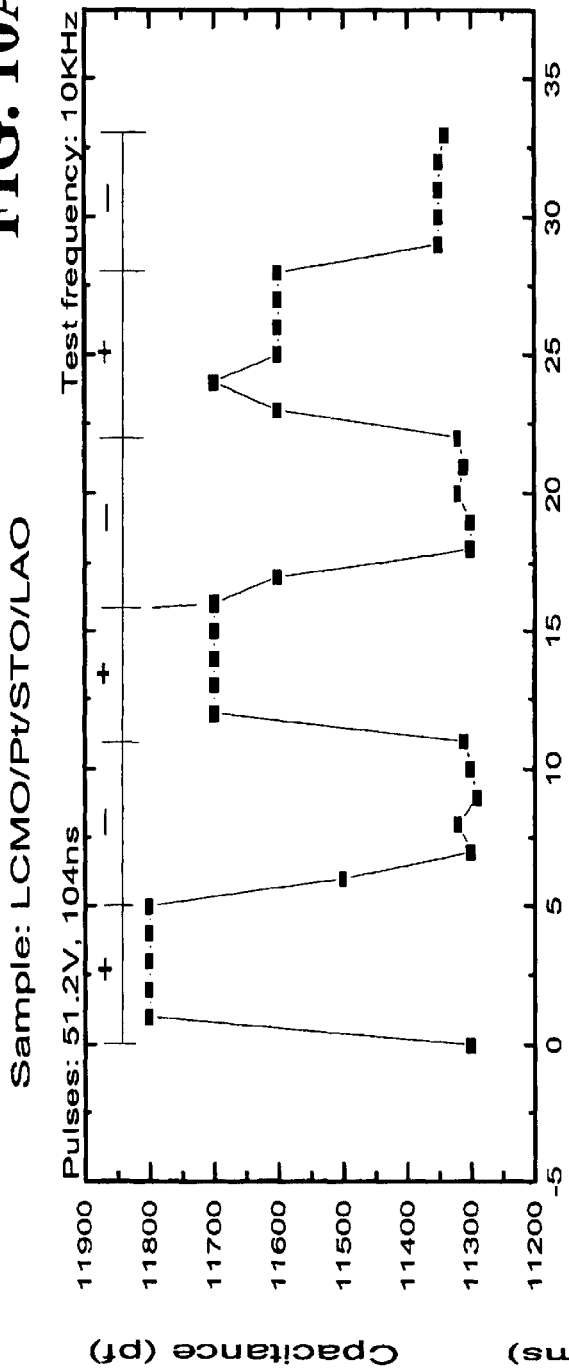
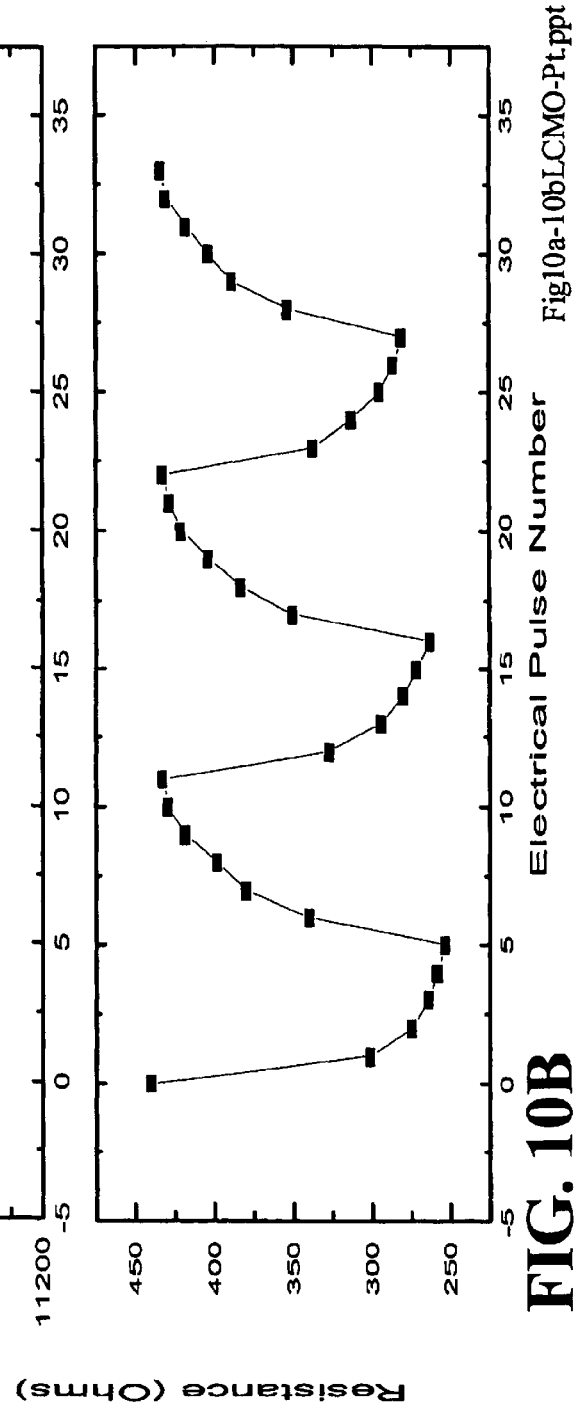
FIG. 10A
FIG. 10B

ELECTRICALLY PROGRAMMABLE NONVOLATILE VARIABLE CAPACITOR

BACKGROUND OF THE INVENTION

1. Field of the Invention

The present invention relates to perovskite materials and especially to colossal magnetoresistive materials used as an active dielectric medium in a capacitance apparatus and a method of using electrical pulses to change the non-volatile capacitance values, where each capacitance value is maintained without constant consumption of electric power.

More particularly, the present invention relates to a capacitance apparatus including a substrate having formed thereon a multi-layered, non-volatile, programmable or variable capacitive element or capacitor including a bottom conducting layer, an active layer, and a top conducting layer, where each capacitance value is maintained without constant consumption of electric power. The present invention also relates to methods for making and using the apparatus.

2. Description of the Related Art

Capacitors are one of the three basic electronic elements along with resistors and inductors that make up all passive electrical circuits. In many electric circuit applications, there is a need to change the capacitance value of a capacitor. Such application include non-volatile memories, filters, oscillators, modulators, resonance circuits, etc., in the computer and telecommunication industries, power generation and delivery in the utility industry, and in other fields such as electroacoustics, remote sensing and the like.

Early methods of varying the capacitance value of a capacitor used mechanical means. For example, a set of flat-plated electrodes are mounted on a rotating shaft. By rotating the shaft, the set of moving electrodes engages more or less with a set of fixed flat-plated electrodes hence change their common area. The capacitance of the whole assembly therefore changes accordingly. An alternative method involves adjusting a screw, which adjusts the gap between two opposite electrodes to reach capacitance variation. With these devices automation of capacitance change is difficult if not impossible.

Recent capacitance-varying semiconductor devices are collectively known as varactors. A varactor is a p-n junction diode or a Schottky junction diode that is properly doped with impurity elements. A space-charge region depleted of charge carriers, known as the depletion region, exists at the junction. The depletion region has a build-in capacitance, which is inversely proportional to the width of the depletion region. By applying different values of reverse biases to the junction, the width of the depletion region changes and the capacitance of the junction, therefore, changes accordingly. See, e.g., Robert L. Boylstad and Louis Nashelsky, "Electronic Devices and Circuit Theory", pp814–818, $7^{th}$ edition, Prentice Hall, 1999, Sata, et al, U.S. Pat. No. 4,449,141, May 15, 1984; Sakai, et al, U.S. Pat. No. 4,529,995, Jul. 16, 1985, incorporated herein by reference.

Since a varactor is a voltage controlled device, automation of capacitance change is easy. The other advantage of varactor over the early capacitance-varying devices relates to the maturity of semiconductor device integration.

The major drawback of a varactor is its constant consumption of electric power during the maintenance of a particular capacitance value, since a constant bias voltage must be applied to the varactor during this period. The power consumption is manifested as dissipation due to reverse-bias leakage current. Collectively, on an integrated circuit, this power consumption can be significant and depends upon the extent of integration. The dissipated heat in turn heats up the circuit and may cause instability of the entire integrated circuit. Also, in critical applications such as in remote sensing, every effort is needed to save electric energy; this waste of electric power is therefore undesirable.

The second drawback of a varactor is the mutual influence between the bias voltage and the voltage of the active signal. Superimposition of these two voltages causes capacitance deviation from the originally desired capacitance value. This leads to performance deterioration, for example, frequency instability in an oscillator circuit or a resonance circuit.

The third drawback of the varactor is its volatile nature of capacitance change. As soon as the bias voltage is withdrawn from the varactor, the device completely losses its memory of its previously attained capacitance value.

Ferroelectric capacitance is a non-volatile capacitance. A ferroelectric capacitance can be partially changed by applying an electrical pulse with pulse duration shorter than the time period required to reach the spontaneous polarization of the ferroelectric film. Partial polarization changes (capacitance changes) in ferroelectric films induced by short electrical pulses have been proposed as a pulse frequency modulation (PFM) system to be used in neuron circuits (see, e.g., "Proposal of adaptive-learning neuron circuits with ferroelectric analog-memory weights," Hiroshi Ishiwara, Japan Journal Applied Physics, Vol. 32, PP. 442–446, 1993). However, non-volatile ferroelectric capacitors and PFMs are limited in applications due to the retention problems of ferroelectric materials and destructive read-out processes.

Thus, there is a need in the art for a variable capacitive apparatus with a basic structure that can overcome the above articulated drawbacks of its predecessors, and a convenient and retentive method to actuate the capacitance changes.

SUMMARY OF THE INVENTION

The present invention provides a non-volatile, simple-structured, robust, reliable, programmable or variable capacitor, where each capacitance value of the capacitor is maintained without constant consumption of electric power.

The present invention also provides a variable, non-volatile capacitor including a multi-layered thin film structure having a first or bottom conducting layer and a second or top conducting layer with an active dielectric layer interposed therebetween, where the structure changes capacitance in response to an electric pulse applied thereto and where each capacitance value of the capacitor is maintained without constant consumption of electric power.

The present invention also provides a non-volatile, variable capacitance apparatus or capacitor including a substrate having a multi-layered thin film structure deposited thereon, where the structure includes a first or bottom conducting layer and a second or top conducting layer with an active dielectric layer interposed therebetween, where the structure changes capacitance in response to an electric pulse applied thereto and where each capacitance value of the capacitor is maintained without constant consumption of electric power.

The present invention also provides a circuit including at least one non-volatile, variable capacitor apparatus of this invention, where each capacitance value of the capacitor is maintained without constant consumption of electric power.

The present invention also provides a circuit including a least one simple-structured, non-volatile, programmable capacitor capable of being set to two or more capacitance values, where the capacitance of the capacitor can changed to one of its allowed non-volatile values by applying at least one electric pulse to the capacitor depending on a desired circuit output, where each capacitance value of the capacitor is maintained without constant consumption of electric power.

The present invention also provides a simple two-terminal capacitive apparatus or capacitor including a perovskite material such as a colossal magnetoresistive (CMR) material, which comprises an active dielectric medium sandwiched or interposed between to conducting layers, where the active medium changes its capacitance when exposed to one or more electric pulses, where each capacitance value of the capacitor is maintained without constant consumption of electric power.

The present invention provides a new simpler method to set and/or tune a capacitance value of a non-volatile programmable or variable capacitor of this invention and to a method to reproducibly erase and sense the capacitance of the capacitors of this invention by applying one or more electric pulses to the capacitor, where each capacitance value of the capacitor is maintained without constant consumption of electric power.

The present invention also provides a method for adjusting an output of a circuit including the step of changing a capacitive value of at least one capacitor of this invention included in the circuit by applying one or more electric pulses until a desired circuit output is achieved, where each capacitance value of the capacitor is maintained without constant consumption of electric power.

The present invention also provides a method to tune a circuit including the steps of providing a circuit including at least one variable capacitor of this invention, where each capacitance value of the capacitor is maintained without constant consumption of electric power; obtaining a first circuit output; comparing the first circuit output to a desired circuit output; applying an electric pulse to at least one variable capacitor of this invention to change a capacitance of the capacitor from a first capacitance value to a second capacitance value, obtaining a second circuit output and comparing the second output to the desired output. The method can also include repeating the applying step, the second obtaining step and the second comparing step until a difference between the actual circuit output and the desired circuit output is a minimum. The application can also be run in reverse to detune a circuit.

DESCRIPTION OF THE DRAWINGS

The invention can be better understood with reference to the following detailed description together with the appended illustrative drawings in which like elements are numbered the same:

FIG. 4 is a plot of capacitance and resistance change versus pulse numbers for an Au/PCMO/YBCO/LAO preferred apparatus of this invention;

FIG. 9 is a capacitance and resistance vs. pulse number for a preferred PCMO on Pt film low electrode apparatus of this invention;

FIG. 10 is a capacitance and resistance vs. pulse number for a preferred of LCMO/Pt apparatus of this invention;

DETAILED DESCRIPTION OF THE INVENTION

Figure 1A:
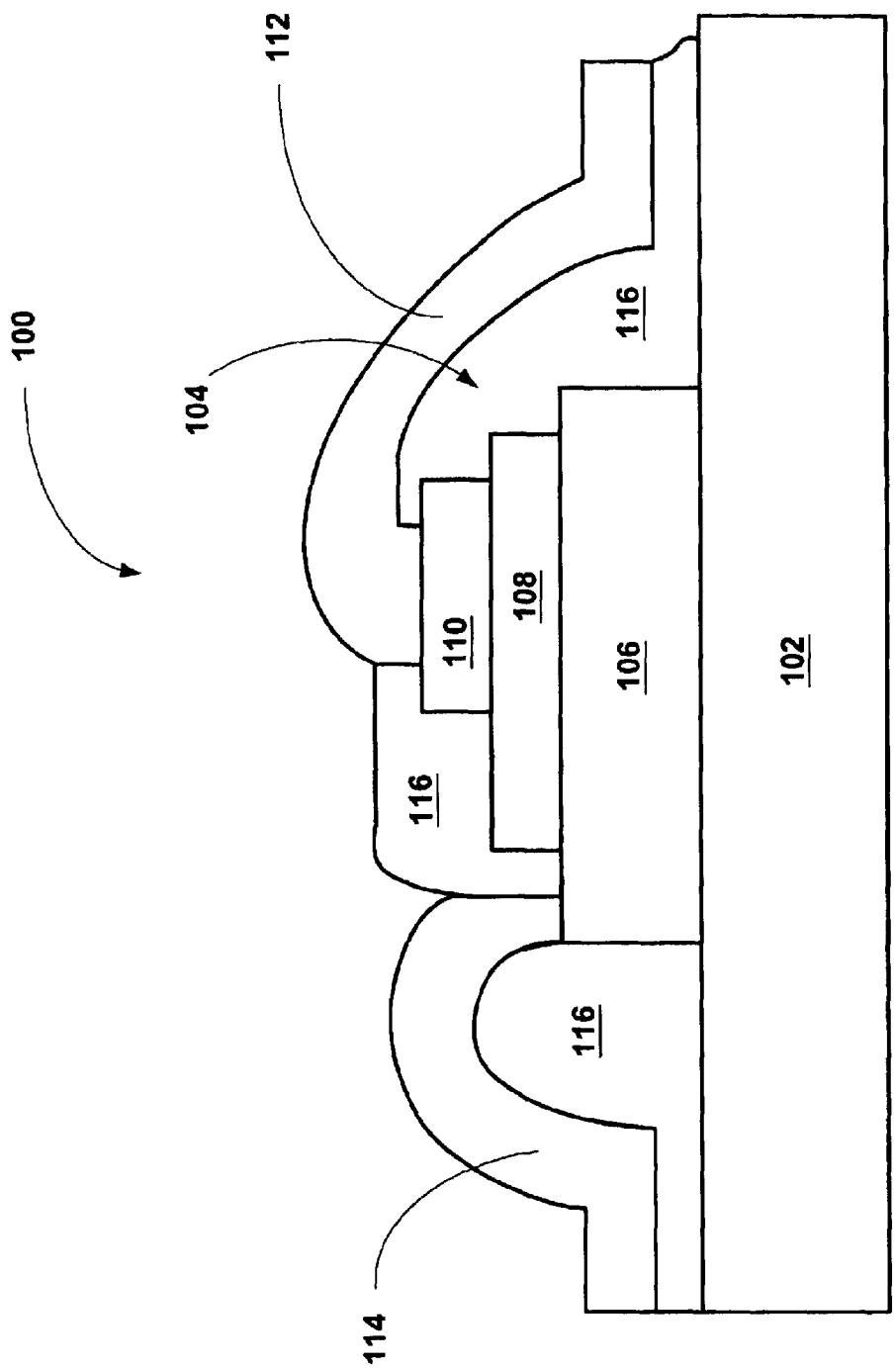
FIG. 1A depicts a schematic diagram of a preferred embodiment of a tri-layer variable capacitor apparatus of this invention.

The inventors have found a novel electrically set fast multi-staged non-volatile capacitance change effect in perovskite film materials, especially in colossal magnetoresistive (CMR) thin films, at room temperatures. The CMR materials usually show large resistance changes under magnetic field at low temperatures (see, e.g., "Thousandfold change in resistivity in magnetoresistive La—Ca—Mn—O films," Jin, S., Tiefel, T. H., McCormick, M., Fastnacht, R. A., Ramesh, R., and Chen, L. H., Science 264, PP. 413–415, 1994). These materials have been intensively studied in the past decade due to their great potential application in different areas of technology. A novel electrical pulse induced resistance (EPIR) effect was discovered in CMR thin films, and has shown promise for the development of non-volatile resistive memory (see, e.g., "Electric-pulse-induced reversible resistance change effect in magnetoresistive films," S. Q. Liu, N. J. Wu, A. Ignatiev, Applied Physics Letters, Vol. 76, PP. 2749–2751, 2000). The non-volatile resistance change in EPIR effect is induced by the application of low voltage (<3V) and short duration (<5 ns) electrical pulses across a thin film sample of a CMR material at a wide temperature range around room temperature (at least about –70° C. to about 200° C.) and under no applied magnetic field. The pulse can either directly increase or decrease the resistance of the thin film sample depending on pulse polarity. The sample resistance can also be changed in multiple levels—as many as 50 have been observed. Such an EPIR effect has been designed for non-volatile memory switch and multi-valued memory applications (see, e.g., "A new concept for non-volatile memory: the electric-pulse induced resistive change effect in colossal magnetoresistive thin films," S. Q. Liu, N. J. Wu, A. Ignatiev, Proceedings on non-volatile memory technology symposium, Nov. 7–8, 2001, San Diego, Calif., USA, JPL publication 01–15). However, so far, no non-volatile capacitance changes in the CMR thin films induced by either magnetic field or electric field have been reported. Furthermore, variable, reversible, non-volatile capacitance changes described in this invention also exhibited special accordance with EPIR changes.

The present invention broadly relates to a non-volatile, variable capacitor or capacitance device including a thin film construct deposited, supported or formed on a support substrate. The construct includes a first conducting layer and a second conducting layer with an active dielectric layer interposed therebetween, where a capacitance of the construct is changeable upon the application of at least one electric pulse to the conducting layers of the construct. One preferred configuration for the capacitors and/or constructs of this invention is a parallel-electrode sandwich configuration, but other configuration are equally functional such as a vertical configuration, or any other configuration for forming thin filmed elements, which act as a capacitor or have a specific and changeable capacitance. In fact, the configuration of the constructs can be any configuration of components that act as a capacitor or has capacitance. The dielectric medium normally is in a film form. The capacitors of this invention are useful in applications requiring capacitor with multi-valued capacitance, as multi-level value storage apparatus, and for multi-level, or analogous continued capacitance tuning applications.

The present invention also broadly relates to a method for varying a capacitance of a non-volatile, variable capacitor of this invention, including the step of applying one or more electric pulses to the capacitor of this invention until a desired capacitance is achieved. The invention also broadly relates to a method of tuning a circuit including at least one non-volatile, variable capacitor of this invention including the step of applying at least one electric pulse to the capacitors until a desired circuit output is achieved. The method can also involve steps of comparing a first output to the desired circuit output and a second circuit output to the desired output and continuing electric pulses and comparing until a difference between the circuit output and the desire circuit output is a minimum.

The capacitance and capacitance changes of the capacitors of this invention depend on an amplitude and duration of applied electrical pulse(s), and the capacitance is capable of attaining a quantitatively defined value in a certain frequency range of applied pulses. A desired capacitance can be achieved either by applying multiple pulses having the same voltage and duration or by applying multiple pulses having different voltages or/and durations.

For realizing a two discrete capacitance value format using the capacitors of this invention, voltage pulses of opposite polarities are applied to the capacitor. Thus, a pulse having a first polarity when applied to the capacitor would set the capacitor to a first state having a first capacitance, i.e., capacitance value of 1 or a 0 state. While a pulse having a second and opposite polarity when applied to the capacitor would set the capacitor to a second state having a second capacitance, i e., capacitance value of 2 or a 1 state. In this fashion, the capacitor is changed between the first state and the second state depending on whether the value of the capacitor is 1 or 2, or the state of the capacitor is 0 or 1. Alternatively, the capacitor could be varied between a null or initial state, and a first (plus) state of a second (minus) state. Thus, a plus write step is accomplished by applying a first polarity pulse to the capacitor when it is in the null state, which sets the capacitor to the first state. Erasure of the plus write step is accomplished by applying an opposite polarity pulse to the capacitor setting the capacitor state back to its null state. Conversely, a minus write step is accomplished by applying an opposite polarity pulse to the capacitor, which sets the capacitor to the second state. Erasure of the minus write step is accomplished by applying an opposite polarity pulse to the capacitor setting the capacitor state back to its null state.

To read the state of a capacitor of this invention, the read operation or step, is accomplished by applying an alternating or a step voltage, where the voltage has an amplitude sufficiently less than an amplitude of the write and erase pulses in a moderate frequency range or an equivalent moderate frequency range, which depends on the active dielectric materials used in the construct without causing a substantial change in the capacitance of the capacitor. Clearly, non-volatile, variable capacitors of this invention, that are designed to transition between two states or three states, represent elements with switchable, binary capacitance and are capable of carrying and storing binary information finding application in standard digital or binary logic applications—transitions between a logical 0 state and a logical 1 state or a binary 0 and a binary 1.

Although a binary or trinary state capacitor has many direct applications in standard integrated circuits and digital processing units, the capacitors of this invention are capable of being transitioned through many capacitance states by the application of multiple pulses to produce incremental capacitance changes. Therefore, the capacitance values of the capacitors of this invention can be set or transitioned between not only two or three non-volatile states, but can also be set or transitioned between multiple discrete levels or states. In fact, the capacitors of this invention may even be able to transitions between capacitance values in a continuum, simulating an analog device. The capacitors of this invention attain capacitance value that are non-volatile, and are completely reversed by switching the pulse polarity of the applied pulse or pulses.

Thus, the present invention also relates to arrays of capacitors of this invention used as a read only or random access memory. Each capacitor in the array can be used as binary memory elements capable of transitioning between a first state (0) and a second state (1) via the application of at least on electric pulse of a given amplitude, duration and polarity, where one polarity pulse transitions the capacitors between the 0 and 1 states, while the oppose polarity pulse transitions the capacitors between the 1 and 0 state. Alternatively, the capacitors can be transitioned between a number n of discrete states, where n has a value between about 2 and about 12, preferably between about 2 and about 8, and particularly between about 2 and about 4, so that each capacitor can store a 2 bit value, a 3 bit value, a 4 bit value, etc.

Suitable electrical pulses for setting or transitioning the capacitors of this invention between levels or states include, without limitation, any pulse format that results in a desired state change. Exemplary examples of such pulses include square pulses, triangular pulses, saw-toothed pulses, sine or cosine pulses or other waveform pulses. In fact, the pulses can be of any waveform provided that the pulses can create a sufficiently high electric field strength and/or electric current density in the active dielectric material, such as a perovskite material, to modify its state, without exceeding a critical value, the breakdown value, which can damage, harm or destroy the active layer. Generally, the pulses have an amplitude at least 10% below the critical amplitude, the amplitude which destroys the active layer, preferably, at least 15% below the critical amplitude, and particularly, at least 20% below the critical amplitude. It should be recognized that the critical amplitude will vary depending on the exact composition of the active layer, the thickness of the layers and other physical, electrical and/or chemical properties of the construct.

The novel electrically set, non-volatile, variable capacitors of this invention are well-suited to replace the existing variable capacitors in well-known capacitance tuning and capacitive digital storage applications. The capacitors of this invention are ideally suited for applications including binary or multi-level, non-volatile, capacitive memory storage devices, filters, oscillators, resonators, couplers, AC current adjustors, and charge storage devices. These applications need capacitive elements that are capable of attaining variable, non-volatile capacitance values without constant consumption of electric power. Additionally, these application require capacitive elements that are small in size, are simple in structure, are fast, are easy and convenient to control, have high level retention and potentially have high radiation hardness. See, e.g., Robert L. Boylstad and Louis Nashelsky, "Electronic Devices and Circuit Theory," pp814–818, 7$^{th}$ edition, Prentice Hall, 1999, Kenneth E. Mortenson, "Variable Capacitance Diodes," Artech House, Inc., 1974 and M. J. Howes and D. V. Morgan, "Variable Impedance Devices," John Wiley & Sons, 1978.

This invention is based on the discovery that a construct including an active dielectric material sandwiched between two conducting layers possesses the property of electrical pulse induced capacitance (EPIC), where the construct can be adjusted to a target capacitance value by applying one or more pulses having suitable amplitudes and durations. The constructs of this invention are capable of being transitioned between capacitive values by applying a single electric pulse having a desired amplitude and duration, a plurality of electric pulse having desired amplitudes and durations, where the amplitudes and/or durations can be the same or different, or a series or sequence of pulses, each pulse having a desired amplitude and duration, where each pulse can have the same or different amplitude and/or duration. The novel electrically set, fast, variable/programmable, non-volatile capacitance change effect is found in perovskite thin film materials, especially in colossal magnetoresistive (CMR) thin film materials, at room temperature.

Referring now to FIG. 1A, a preferred embodiment of a variable capacitor of this invention, generally 100, is shown as a two terminal apparatus having three thin films or layers. The capacitor 100 include a substrate 102 having formed thereon an electrical pulse induced capacitance (EPIC) element 104 formed thereon. The substrate 102 can be a semiconductor wafer, a semiconductor wafer plus a diffusion/buffer layer formed thereon, a semiconductor device, a semiconductor circuit, a part of semiconductor circuit, or an oxide wafer. The EPIC element 104 includes a first conducting layer or electrode 106, an active dielectric layer 108, and a second conducting layer or electrode 110. Thus, the active dielectric layer 108 is interposed between the two electrodes 106 and 110. Moreover, the layers do not have to be co-extensive as is clear from the figure. The capacitor 100 also includes a first metallic terminal 112 in electrical contact with the second or top electrode 110, and a second metallic terminal 114 in electrical contact with the first or bottom electrode 106. The EPIC capacitor element 104 is surrounded by an insulating matrix 116.

Figure 1B:
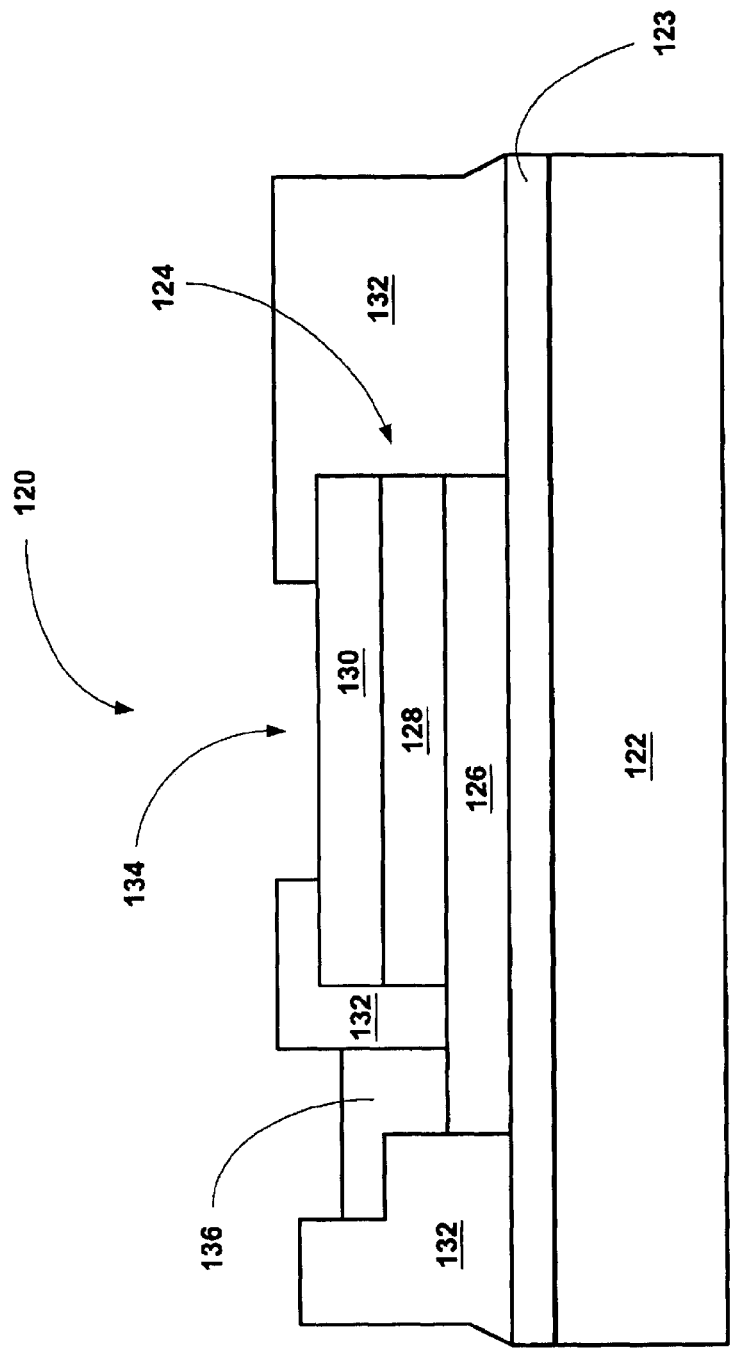
FIG. 1B depicts a schematic diagram of another preferred embodiment of a tri-layer variable capacitor apparatus of this invention.

Referring now to FIG. 1B, another preferred embodiment of a variable capacitor of this invention, generally 120, is shown to include a substrate 122 and a barrier layer or diffusion buffer 123 having an EPIC element 124 formed thereon. The EPIC element 124 includes a first conducting layer or electrode 126, an active dielectric layer 128, and a second conducting layer or electrode 130. Thus, the active dielectric layer 128 is interposed between the two electrodes 126 and 130. The EPIC capacitor element 124 is surrounded by an insulating matrix 132 except for a portion 134 of the second conducting layer 130 which acts as an element terminal. The capacitor 120 also includes a metallic terminal 136 in electrical contact with the first or bottom electrode 126.

Figure 1C:
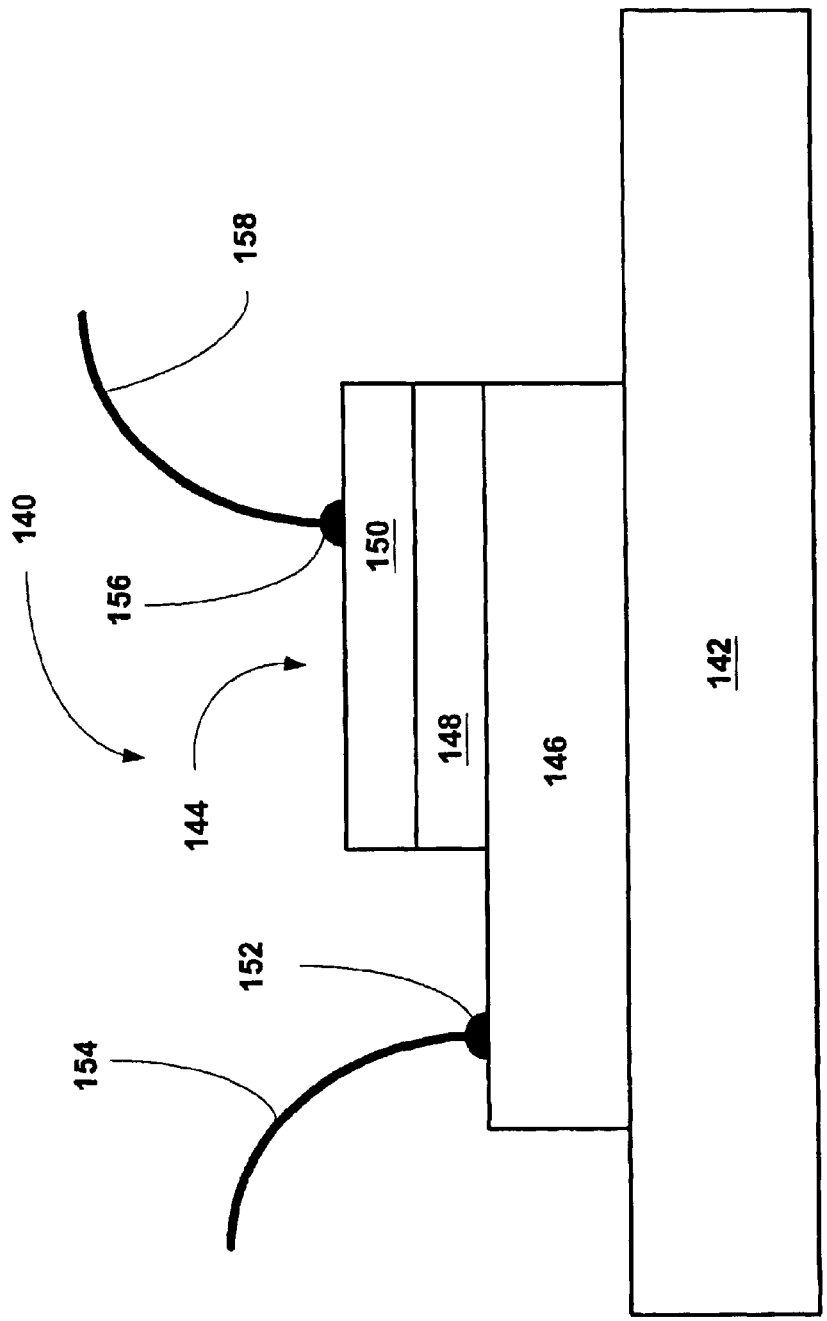
FIG. 1C depicts a schematic diagram of another preferred embodiment of a tri-layer variable capacitor apparatus of this invention.

Referring now to FIG. 1C, another preferred embodiment of a variable capacitor of this invention, generally 140, is shown to include a substrate 142 having formed thereon an EPIC element 144 formed thereon. The EPIC element 144 includes a first conducting layer or electrode 146, an active dielectric layer 148, and a second conducting layer or electrode 150. Thus, the active dielectric layer 148 is interposed between the two electrodes 146 and 150. The element 144 also includes a first wire bonded contact 152 with associate wire 154 bonded to the first conducting layer which acts as a first element terminal. The element 144 also includes a second wire bonded contact 156 with associate wire 158 bonded to the first conducting layer which acts as a second device terminal. It should be apparent from FIG. 1C, that the capacitors of this invention can be constructed without the use of an insulating material, relying on air or vacuum instead.

Figure 1D:
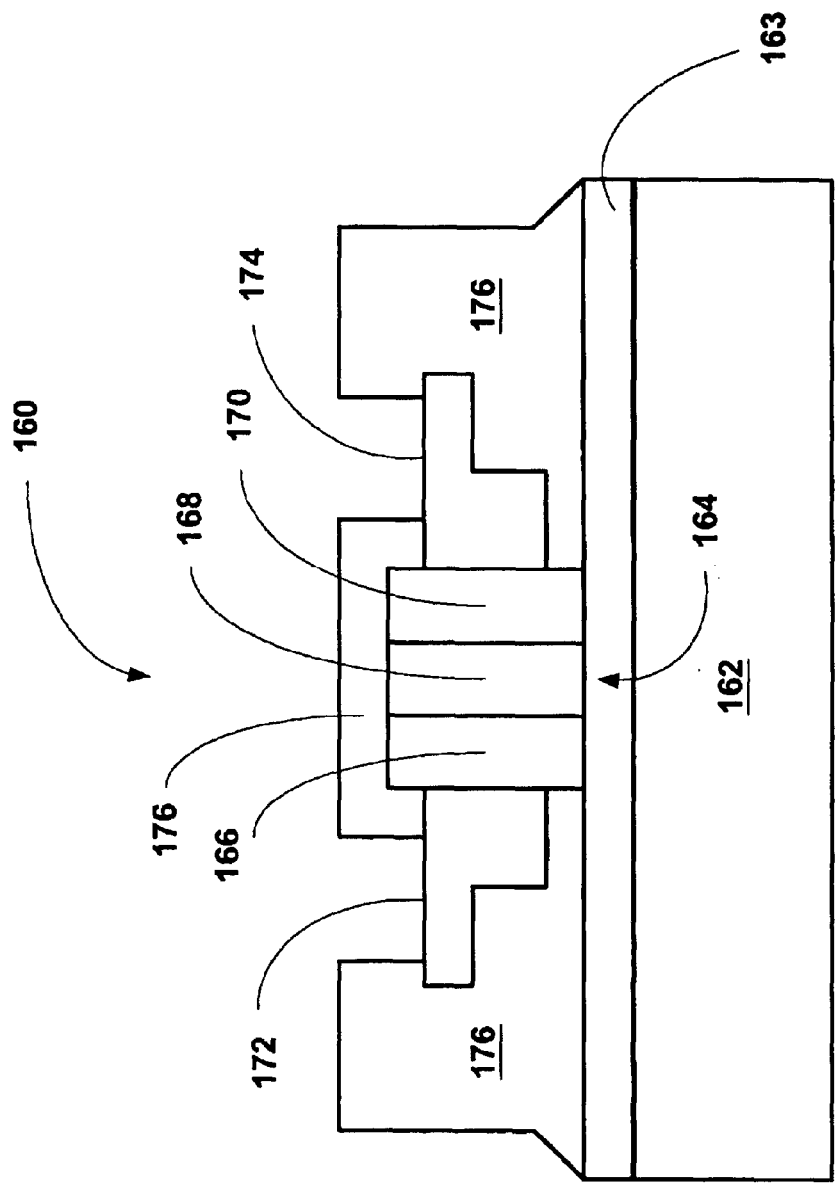
FIG. 1D depicts a schematic diagram of another preferred embodiment of a tri-layer variable capacitor apparatus of this invention.

Referring now to FIG. 1D, another preferred embodiment of a variable capacitor of this invention, generally 160, is shown to include a substrate 162 and a barrier layer or diffusion buffer 163 having an EPIC element 164 formed thereon. The EPIC element 164 includes a first conducting layer or electrode 166, an active dielectric layer 168, and a second conducting layer or electrode 170. Thus, the active dielectric layer 168 is interposed between the two electrodes 166 and 170. The capacitor 160 also includes a first metallic terminal 172 in electrical contact with the first or bottom electrode 166, and a second metallic terminal 174 in electrical contact with the second or top electrode 170. The EPIC capacitor element 164 is surrounded by an insulating matrix 176.

Figure 1E:
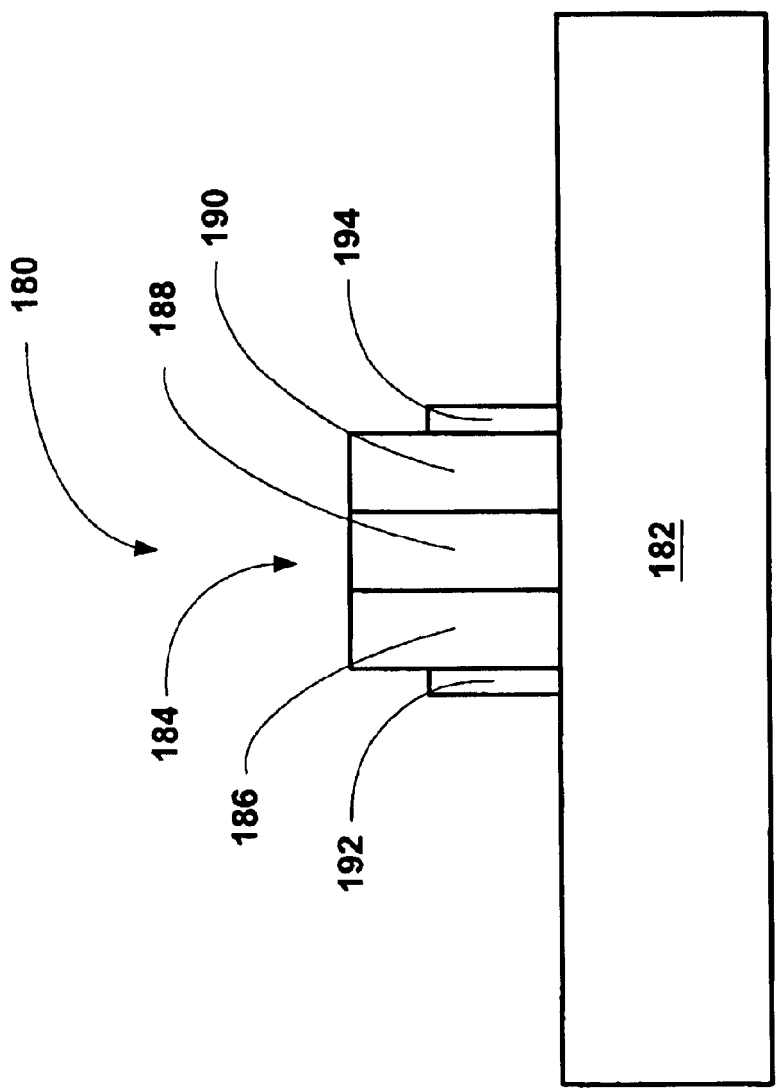
FIG. 1E depicts a schematic diagram of another preferred embodiment of a tri-layer variable capacitor apparatus of this invention.

Referring now to FIG. 1E, another preferred embodiment of a variable capacitor of this invention, generally 180, is shown to include a substrate 182 having formed thereon an EPIC element 184 formed thereon. The EPIC element 184 includes a first conducting layer or electrode 186, an active dielectric layer 188, and a second conducting layer or electrode 190. Thus, the active dielectric layer 188 is interposed between the two electrodes 186 and 190. The capacitor 180 also includes a first metallic terminal 192 in electrical contact with the first or bottom electrode 186, and a second metallic terminal 194 in electrical contact with the second or top electrode 190. It should be apparent from FIG. 1C, that the capacitors of this invention can be constructed without the use of an insulating material, relying on air or vacuum instead.

The active layer 108, 128, 148, 168 or 188 comprises a material capable of taking two or more capacitance states, i.e., the material is a non-volatile, variable or programmable capacitor. The material comprises a material with a perovskite lattice structure. Preferred materials include, without limitation, colossal magnetoresistive (CMR) materials, giant magnetoresistive (GMR) materials or high temperature superconducting (HTSC) materials, or mixtures or combinations thereof. Exemplary examples of CMR materials include, $Pr_{1-x}Ca_xMnO_3$ (PCMO), $La_{1-x}Ca_xMnO_3$ (LCMO), $La_{1-x}Sr_xMnO_3$ (LSMO), $Nb_{1-x}Ca_xMnO_3$ (NCMO), or other similar CMR materials or mixtures or combinations thereof.

Suitable electrical conducting layers or electrodes 106 and 110, 126 and 130, 146 and 150, 166 and 170, or 186 and 190 include, without limitation, any conductive material capable of being formed on a substrate via known integrated circuit manufacturing processes and is electrically conducting. Exemplary conductive materials are conductive metal, conductive metallic oxide, conductive polymers, conductive ceramics, or the like or mixtures or combinations thereof. Exemplary examples includes, but are not limited to, Pt, Ir, Ag, Au, Cu, $LaSrCoO_3$, $YB_xCuO_{7-x}$, $RuO_2$, $SrRuO_3$, $IrO_2$, doped polyacetylene, doped polyphenylenesulfide, or the like or mixtures or combinations thereof. Metals and metal oxides being preferred.

The capacitance layer, electrode layers and buffer layers (if needed) can be grown by sputtering, pulsed laser deposition (PLD), metal organic chemical vapor deposition (MOCVD), chemical vapor deposition (CVD), metal oxide deposition (MOD), Sol-gel deposition, spin-coating or other methods of oxide film formation or mixtures or combinations thereof.

Figure 2:
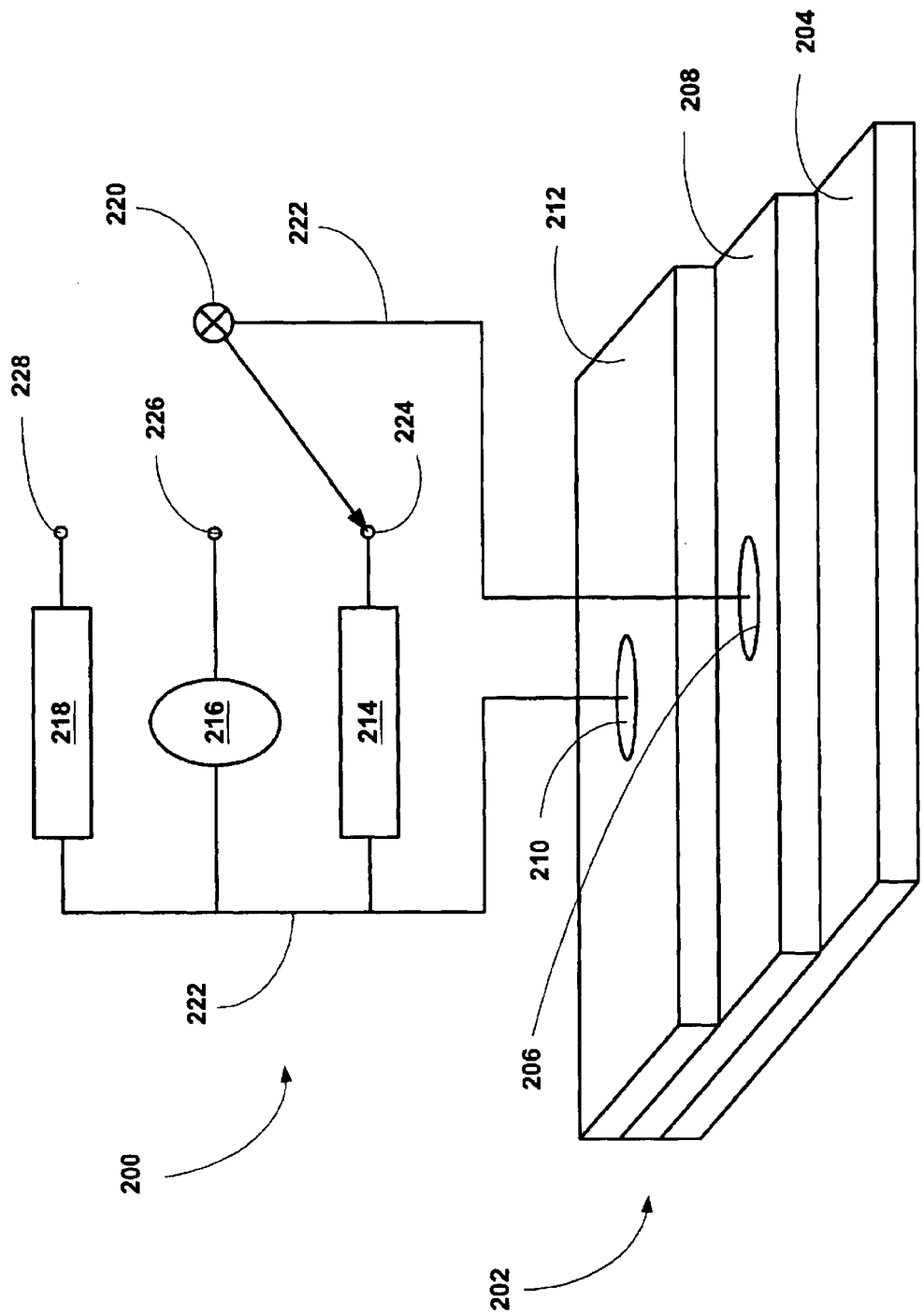
FIG. 2 depicts a schematic diagram of a preferred apparatus of this invention based on PCMO on YBCO or Pt on $LaAlO_3$ substrate, and the connections to external electrical circuit required to write, to erase and to read its capacitance.

Referring now to FIG. 2, a typical layout, generally 200, for measuring the properties of non-volatile, variable capacitance elements of this invention. The layout 200 includes a construct of this invention 202, the sample, deposited on a substrate 204, where the construct includes a first electrode 206 in electrical contact with a bottom conducting layer 208, a second electrode 210 in electrical contact with an active dielectric layer 212. The layout 200 also includes a pulse generator 214, a DC source and meter apparatus 216, an LCR meter or I/G analyzer 218 and a three-way switch 220 adapted to open and close circuit paths. The layout 200 also includes wires 222 interconnecting the circuit components. The switch 220 is shown electrically connected to a first contact 224 in FIG. 2, where the circuit includes the capacitor 202 of this invention and the pulse generator 214. In this position, the circuit allows the capacitor 202 to be exposed to electric pulses designed to cause the capacitor 202 to transition between states. When the switch 220 is set to a second contact 226, the DC source and voltage meter 216 is inserted into the circuit, while removing the pulse generator 214. When the switch 220 is set to a third contact 228, the analyzer 218 is inserted into the circuit.

The layout 200 is used to measure the properties of the capacitor of this invention. Electrical pulses were generated by the pulse generator 214, and were applied to the sample 202 through electrodes 206 and 210. After each pulse was applied to the sample 202, a testing signal from either a LCR multi-meter or an Impedance/Gain (IG) analyzer with a testing voltage of less than 50 mV was applied across the electrodes 206 and 210 (by flipping the switch 220 to its third position 208). The capacitance and the AC resistance values between the bottom electrode pad 206 and the top electrode 210, which are in electrical contact with the conducting layers 208, respectively, was measured by the LCR meter or/and the I/G analyzer. The DC resistance between the electrodes 206 and 210 was also measured. In that case, a constant current of 10 nanoampere to 10 microampere was applied to the sample 202 and the voltage drop between the electrodes 206 and 210 was measured with a high internal resistance voltmeter. The measured capacitance and resistance represent nonvolatile retaining values, since the measurements were done in the absence of the electric pulse field. The layout 200 was used to test serval constructs of this invention, where the conducting layers are YBCO or Pt.

With an increase in amplitude of an applied voltage pulses, the measured capacitance, together with resistance, began to change gradually after the amplitude of the voltage pulse exceeded a threshold value. The threshold value depended on the material used and is about 3V for a typical CMR thin film composed of PCMO having a thickness of about 600 nm using a pulse having a duration of about 100 ns. The capacitance change ratio for the capacitors of this invention can be large even at room temperature and in the presence of a zero applied magnetic field. The threshold voltage also varied depending on sample characteristic parameters, such as film thickness, material composition and annealing process.

The capacitance changes of the capacitors of this invention can be reversed by reversing a polarity of the applied pulse, that is, if a pulse with one polarity caused the capacitance to decrease, a pulse with the opposite polarity caused it increase. The direction of the capacitance change in relation to pulse polarity depended on the processing of the films, the initial state set on the capacitor, and the amplitude and the duration of the applied electrical pulses. Its quantitative value not only depended on the amplitude and the duration of the voltage pulse, but also on the cumulated pulse number and the sample's capacitance change history. The capacitance change can be in the same direction or opposite direction to that of the change in the capacitors resistance. After each change, the capacitance value was stable. This was evidenced by repeated measurements as long as the measurement voltage was much smaller than the threshold value.

Using the layout 200 of FIG. 2, properties of several preferred embodiments of non-volatile capacitance elements of this invention are described. Measurement results were obtained from three different tri-layer structures: Au(Ag)/PCMO/YBCO on $LaAlO_3$ (LAO) substrate, Au(Ag)/PCMO/Pt on $LaAlO_3$ or Pt plate substrates, and Au(Ag)/LCMO/Pt on LAO substrate. This same layout 200 can also be used to characterize any other multi-layer structure of this invention.

EXPERIMENTAL SECTION

EXAMPLE 1

This example illustrates the EPIC properties of PCMO on YBCO film electrode apparatus of this invention.

Figure 3:
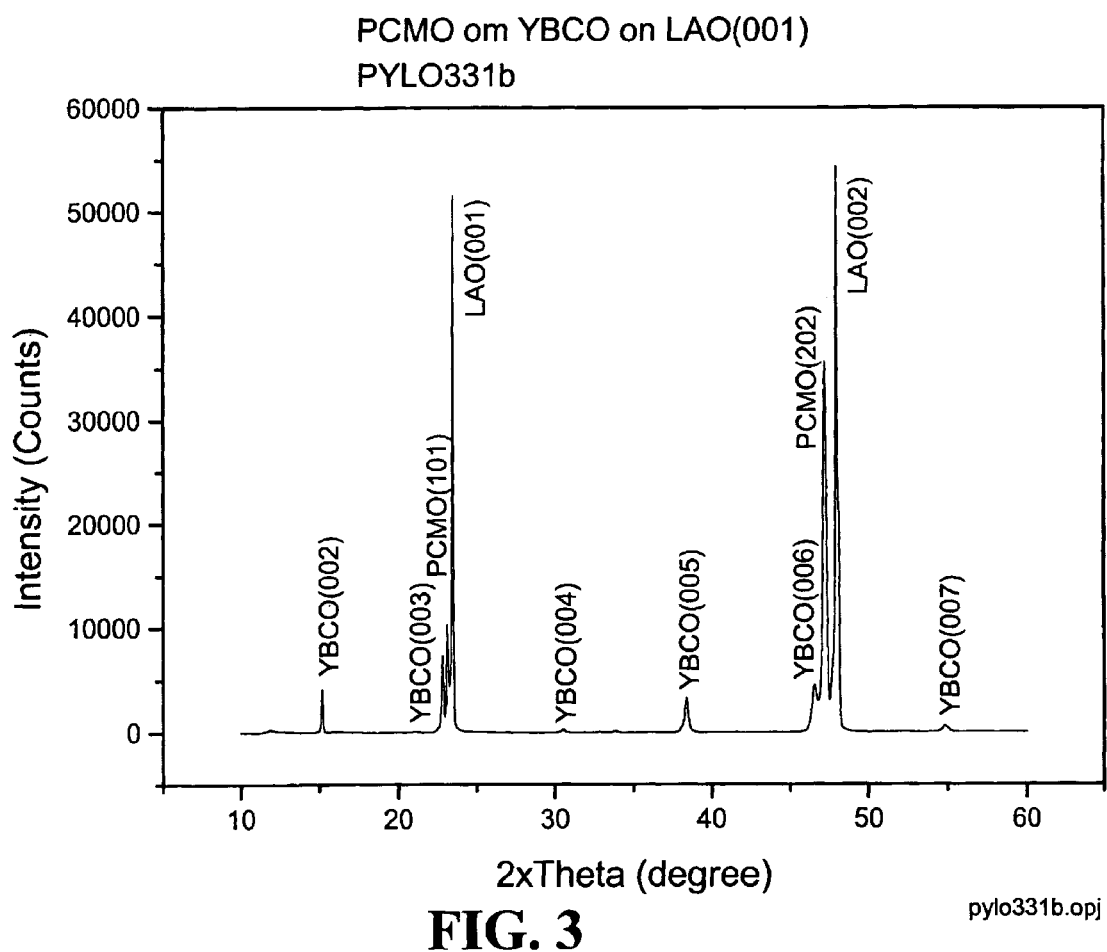
FIG. 3 is an X-ray diffraction $\theta$-$2\theta$ scan of the PCMO/YBCO/LAO heterostructure of the apparatus of FIG. 2.

Perovskite $Pr_{0.7}Ca_{0.3}MnO_3$(PCMO) material was chosen as the first test samples for the electrical-pulse-induced capacitance change experiment. A YBCO layer was used both as the bottom electrode of the device (since YBCO has a room temperature resistivity of ~10 $\mu\Omega$cm), and as an atomic template for PCMO epitaxial deposition. An epitaxial YBCO thin film with thickness range from about 400 nm to about 1 $\mu$m was first deposited on a $LaAlO_3$(100) substrate. An PCMO film of thickness range from about 100 nm to about 1 $\mu$m were then deposited onto top of the YBCO layer by means of a contact mask that left a portion of the YBCO exposed. Both the PCMO and YBCO films in this sample were deposited by the pulse laser deposition (PLD) method (U.S. Pat. No. 5,512,541). Silver or gold electrode contact pads having a radius of about 0.2 mm to about 0.4 mm were sputtered on top of the PCMO layer as the top electrode, and on top of the exposed part of the YBCO layers as the bottom electrode, also by means of a well designed contact mask. The separations between the top and bottom electrode contact pads were between about 2 mm and about 5 mm. The contact pads were connected to silver wires using silver paint. X-ray diffraction θ-2θ scans as shown in FIG. 3, and pole-figure analyses (not shown here) indicated that the PCMO films were grown epitaxially with a (001) normal orientation on the atomically ordered YBCO/LAO structure with an exceedingly high degree of in-plane atomic ordering referenced by a 0.2° Full Width at Half Maximum of the (024) peak in the φ-scan.

Because the electric resistivity of the PCMO layer was much higher than that of the YBCO, and the thickness of the PCMO was much smaller than the distance between the electrode contact pads 206 and 210, the pulsed current was localized principally vertically through the PCMO layer and horizontally through the YBCO when electrical pulses were applied from one electrode to the other.

Typical curves of capacitance and resistance changes versus pulse numbers taken from an Au/PCMO/YBCO/LAO tri-layer sample at room temperature (about 23° C.) are shown in FIGS. 4A–B. Here an positive polarity pulse is defined as a pulse current that flows through the PCMO layer from the top electrode 210 to the bottom electrode 206. The capacitance values of the sample at about 20 kHz and about 200 kHz both decreased when positive pulses where applied across the electrodes 206 and 210. If the pulse amplitude was high enough, the capacitance value could be decreased to its saturated low limit even after the application of a single pulse. In this diagram, two pulses were used to cause the capacitance value to decrease to its saturated low limit. Further positive pulses only decreased the capacitance marginally. Afterwards if reversing the pulse polarity, the capacitance goes up. After that, if reversing the filed direction again, the capacitance will drop again. FIG. 4A shows the non-volatile capacitance change vs. electrical pulse number for an Au/PCMO/YBCO sample on LAO (100) substrate. In this sample, the PCMO film had a thickness of about 600 nm. The non-volatile capacitance of the constructs of this invention was switched by positive and negative pulses, where the pulse voltage was about 18V and duration was about 103 ns. The sensing signal was about 0.01V at about 20 KHz and about 200 KHz as shown in the figure.

The non-volatile electrical-pulse-induced capacitance (EPIC) ratio is defined by the following equation:

$$\Delta C/C_{MIN} = (C_{MAX} - C_{MIN})/C_{MIN}$$

where $C_{MAX}$ and $C_{MIN}$ are the maximum and minimum non-volatile capacitance induced by electrical pulses, respectively. FIG. 4A shows that a non-volatile EPIC ratio of 110% at room temperature was obtained for this sample.

The resistance changes of this sample after each pulse was also measured, as shown in FIG. 4B. As with the EPIC ratio, a similar non-volatile electrical-pulse-induced resistance (EPIR) ratio can be defined as follows:

$$\Delta R/R_{MIN} = (R_{MAX} - R_{MIN})/R_{MIN}$$

where $R_{MAX}$ and $R_{MIN}$ are the maximum and minimum non-volatile resistance values induced by electrical pulses, respectively. The sample had an EPIR ratio of about 770%. Furthermore, it should be noted that the resistance change direction is the same as the capacitance change direction, that is, the positive pulse made the resistance drop for this sample, and the negative one made it rise.

The measured capacitance values depend on the testing signal frequency. In order to test the sample capacitance change within a continuous frequency range and to increase the measuring precision, an impedance/gain phase analyzer (Solartron 1260) was used. The instrument measures the complex impedance of the sample as a pair of values Z' and Z" for each frequency f, where Z' is the real part of the complex impedance and Z" is the imaginary part. According to the specification of the instrument, in the frequency range 100 Hz to 1 MHz, which is the range of interest in measuring the capacitance values of the capacitors of this invention. For a typical sample having a resistance in a range between about 100Ω and about 10 KΩ, the error of the measurement due to the instruments is no greater than about 0.2%.

Figure 5:
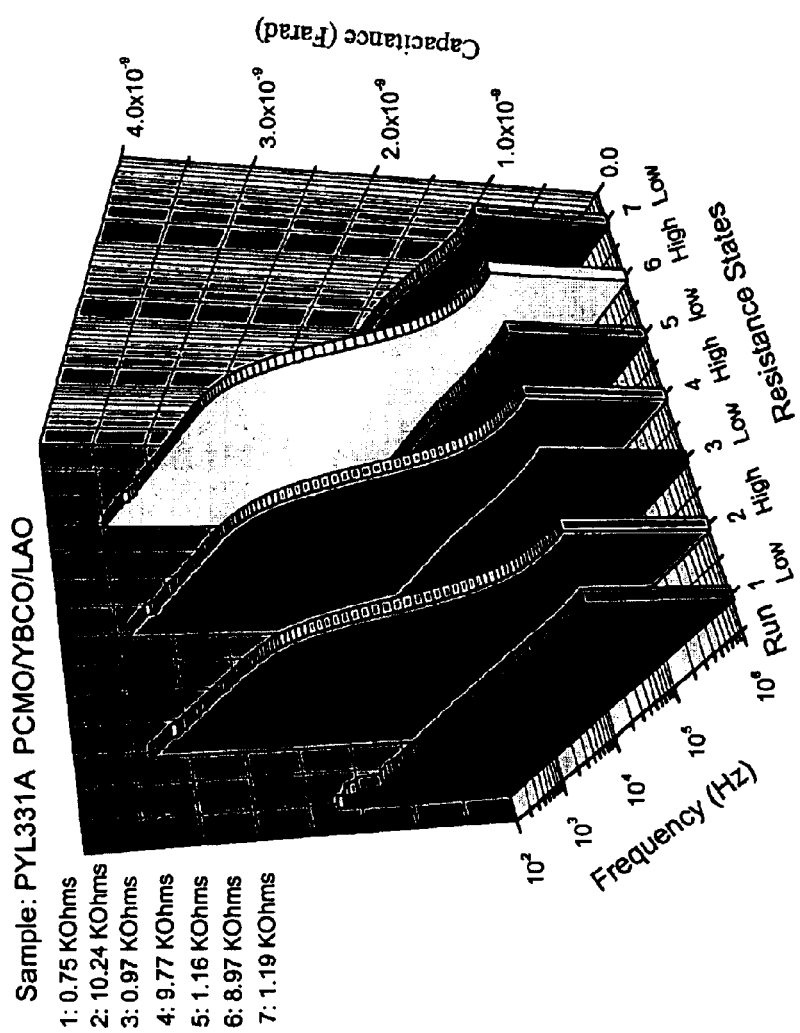
FIG. 5 is a capacitance and resistance vs. frequency plot in 7-Runs, measured by Solartron 1260 impedance/gain phase analyzer (3D figure)

The measurements were carried out in the following way: In Run 1 of the measurements, the PCMO sample was first connected to a pulse generator and subjected to three (3) positive pulses each having an intensity of about 7.7 V and a duration of about 100 ns. The sample was then disconnected from the pulse generator and connected to the DC source and volt meter 216 and the resistance of the sample was measured using an I–V method with a constant source of 1 µA. The DC resistance was found to be 0.75 KΩ. The sample was then connected to the Solartron 1260 analyzer and measured with an applied alternant voltage of 10 mV and zero bias. The capacitance vs. frequency curve is shown in the capacitance state 1 in FIG. 5. In Run 2 of the measurements, the sample was subjected to three (3) negative pulses having pulse parameters substantially the same as in the first run. The DC resistance was measured and found to be 10.24 Ω. The capacitance vs. frequency curve is shown in the capacitance state 2 in FIG. 5. The pulse conditions and the DC resistance values of seven (7) consecutive Runs of measurements were presented in Table A and in FIG. 5. The test was done at room temperature. The measured non-volatile EPIC ratio at 1 KHz was 114%. In the figure the resistance states indicated by Run numbers 1, 3, 5 and 7 are at low resistance states. Those indicated by Run numbers 2, 4 and 6 are high resistance states. It is apparent from the data, that in this sample the capacitance and the resistance change in the same direction. The measured non-volatile EPIR ratio for this sample is about 400%.

Figure 6:
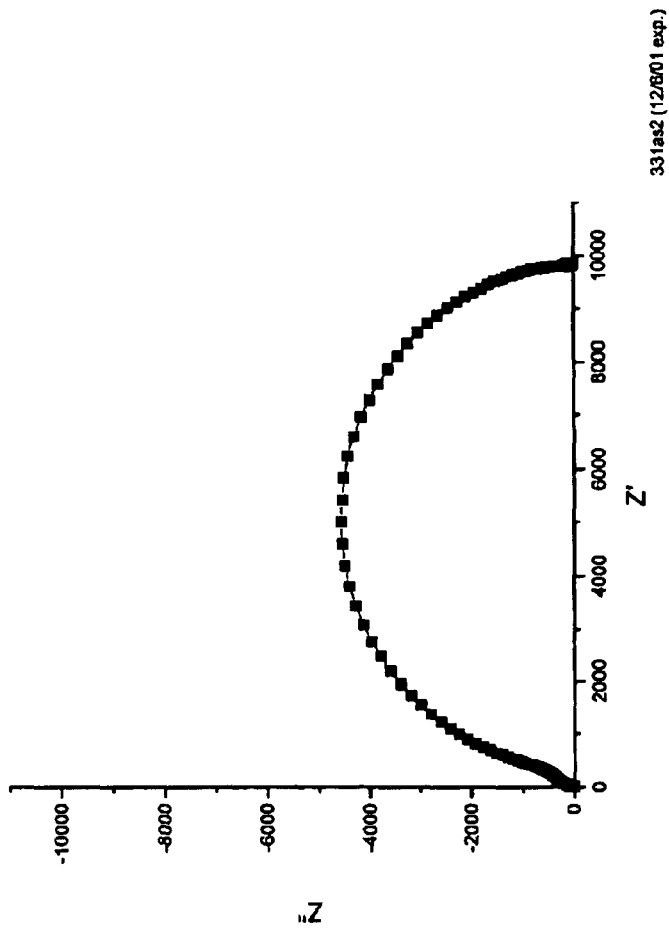
FIG. 6 is a the real part Z' vs. imaginary part Z" of the impedance of an Au/PCMO/YBCO/LAO sample device (the semicircle)

The compressed semicircle curve of Z"-Z' for this sample, as shown in FIG. 6, indicates that the capacitance changes are intrinsic PCMO film characteristics or behavior, and the interfacial influence for the observed effect is negligible.

Figure 7:
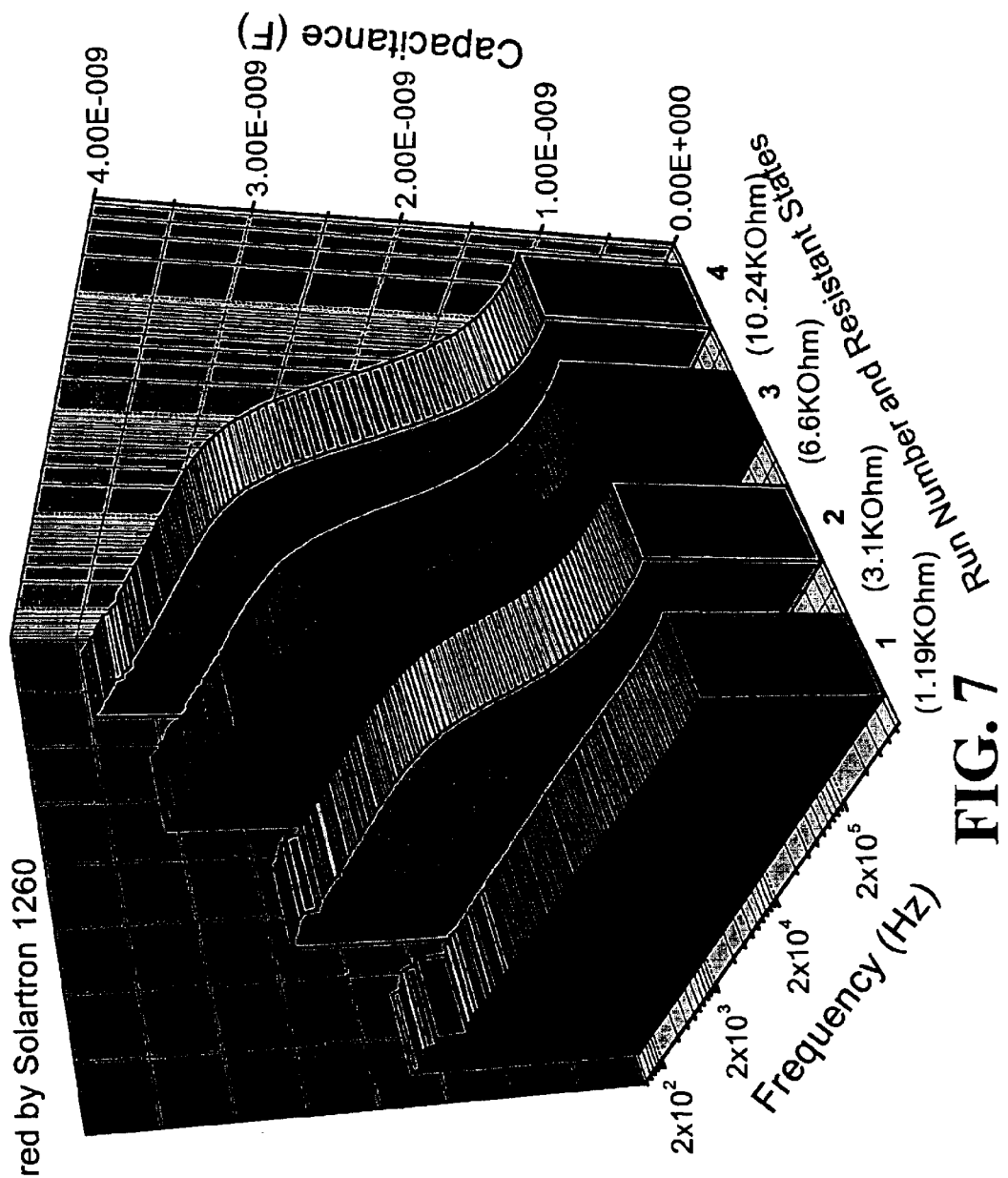
FIG. 7 is a multi-valued capacitance and resistance vs. pulse number measured by Solartron 1260 impedance/gain phase analyzer for the apparatus of FIG. 5.

If the voltage of the applied pulse results in finer increases or decreases in capacitance, then the sample capacitance can be set to a plurality or multitude of discrete non-volatile levels or states. FIG. 7 shows the capacitance change versus the run-number, within the testing frequency range of 100 Hz to 1 MHz for this PCMO/YBCO/LAO sample. By applying a pulse of –6V with a duration of 100 ns to the sample, its capacitance increased to a lower-intermediate capacitance, state 2 from a low capacitance, state 1. After that, a pulse of –7.7V with a duration of 100 ns caused a further increase of the sample's capacitance to an upper-intermediate capacitance, state 3. Finally, a pulse of –8.9V with a duration of 100 ns further increased the sample's capacitance to a high capacitance, state 4. The corresponding resistance values are shown in the figure.

Figure 8:
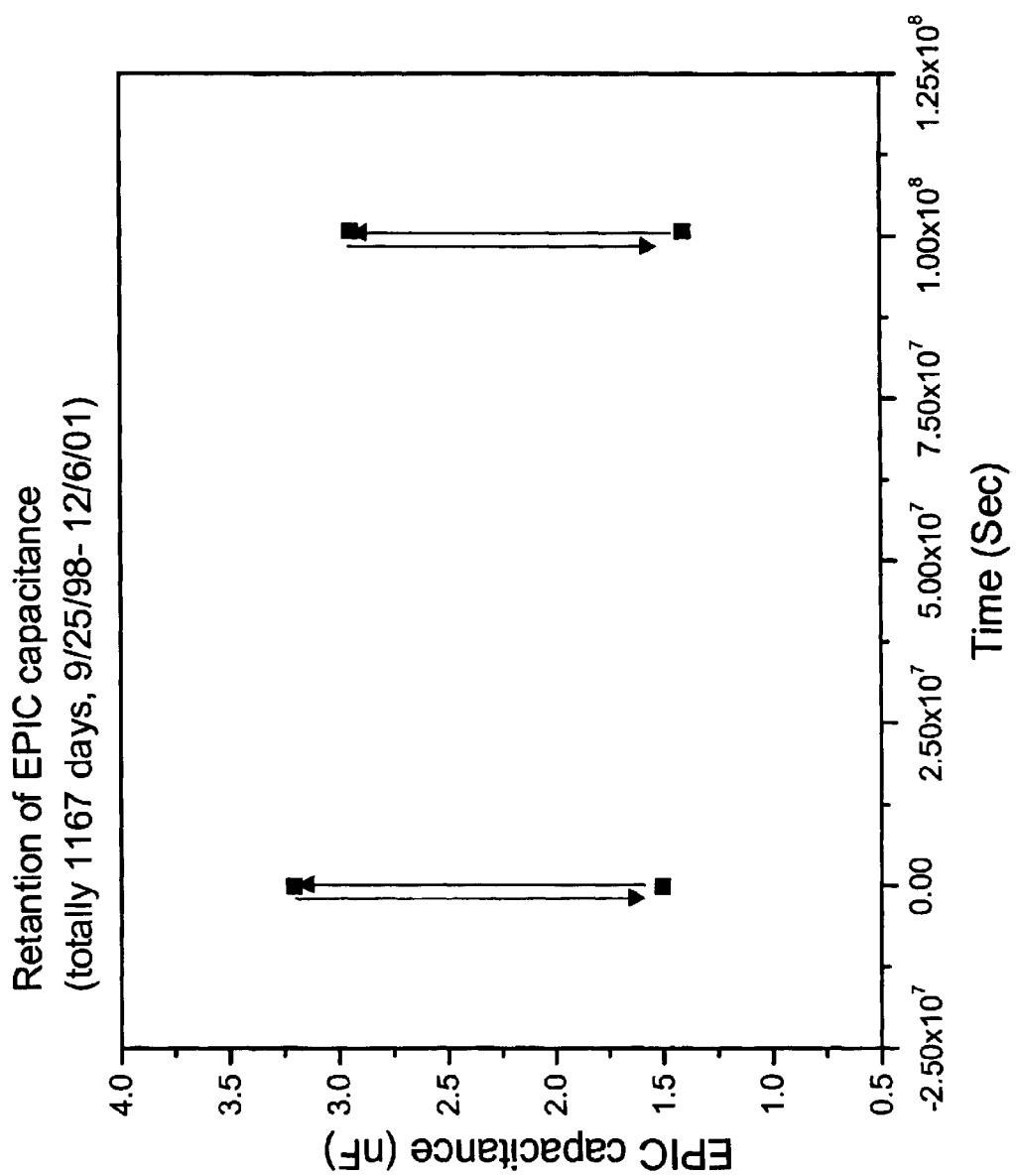
FIG. 8 is a retention of the Au/PCMO/YBCO/LAO of FIG. 6.

The observed phenomenon does not stem from some destructive mechanisms in the material, even though strong enough pulse electric fields are applied to the sample. Proof of this is the repeatability of the observed phenomena which showed time endurance. For example, the sample with data shown in FIG. 8 was fabricated 4 years ago. The first observation on capacitance change was obtained 3 years ago. During the past period, it has been electrically switched several hundreds times; yet, its non-volatile capacitance switching behaviors are still repeatable quantitatively.

With the different sample structure, the different growing or/and processing conditions of the active layers, and some-times the different history of the external electrical fields applied, the direction of non-volatile EPIC change may be opposite to the direction of non-volatile EPIR change. This phenomenon is thought to be caused by the direction dependence of the EPIC change relative to the applied electrical field polarity during electrical switching, while the EPIR changes does not appear to have the same dependence. However, the detailed reasons for the relationships between the EPIC and EPIR change directions are not yet well understood and require further investigation.

EXAMPLE 2

This example illustrates the EPIC properties of PCMO on Pt.

The non-volatile EPIC property is not only observed on the perovskite oxide heterostructure samples (such as PCMO/YBCO), but are also obtained in a CMR material on polycrystal metal low-electrodes. It also means that the EPIC effect is neither an oxide heterostructure behavior, nor oxide interface behavior.

In this example, PCMO films having a thickness of about 1 $\mu$m with polycrystal structure were grown by the pulse laser deposition (POD) method on the top of a Pt film having a thickness of about 0.5 $\mu$m, which was deposited on a $LaAlO_3$ substrate by e-beam evaporation. The non-volatile capacitance changes and resistance changes versus electrical pulse number at room temperature are shown in FIGS. 9A&B. EPIC and EPIR effects are clearly observed for the polycrystal PCMO on metal Pt layer having a polycrystalline structure, and are with the same change direction as the polarity change of the applied electrical pulses. The EPIC and EPIR effects are smaller in this system compared with that of PCMO/YBCO heterostructure system tested above, which is thought to be due to the non-epitaxial lattice structure of PCMO layer.

EXAMPLE 3

This example illustrates the EPIC effect in LCMO/Pt sample.

The EPIC effect is an intrinsic property in perovskite material, particular in CMR material, which can be further supported by the result of EPIC measurements from a LCMO/Pt sampled, in addition to PCMO/YBCO and PCMO/Pt samples.

FIG. 10 shows the capacitance as a function of applied pulse number for pulses having a voltage of about 51 V and a duration of about 100 ns at room temperature and in the absences of magnetic fields, i.e., zero magnetic fields. The reversible capacitance change is clearly observed in the LCMO/Pt film sample.

Figure 11:
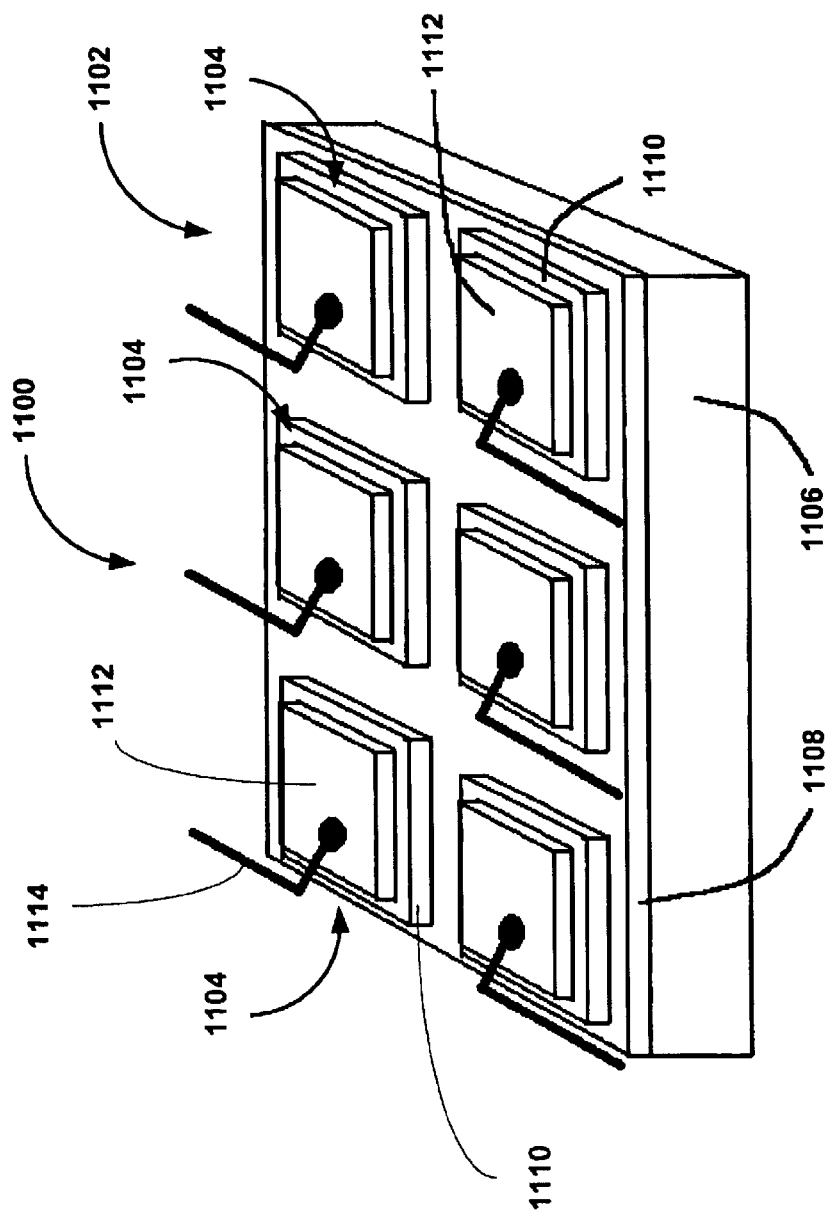
FIG. 11 is a schematic diagram of a section of a memory device consisting of CMR capacitors in an array according to an embodiment of the invention.

Because the perovskite-like materials, especially the CMR, GMR and high temperature superconducting (HTSC) materials are very useful in many fields, the modification method mentioned above has many potential applications Potential Applications As a two-state or multi-state capacitive digital non-volatile storage apparatus, this invention can be used to fabricate non-volatile binary or multi-level memory elements with high integration density, fast speed, non-destructive reading, and high radiation hardness. Referring now to FIG. 11, a section of a memory apparatus of this invention, generally 1100, is shown to include an array 1102 of six CMR capacitors 1104 of this invention. The capacitors 1104 of this invention are constructed on a substrate 1106. First, a conductive layer 1108 (with or without circuitry in the wafer) is formed thereon. This conductive layer 1108 serves as the bottom electrode of each capacitor 1104. Over the conductive layer 1108, a thin layer of a CMR material is grown thereon and etched creating active dielectric film sections 1110 on top of the conductive layer 1108. A top electrode 1112 is then formed on each dielectric film section 1110 completing the capacitors 1104. The arrangement of connecting wires 1114 may adopt the standard schemes, or any other scheme, used in existing integrated circuits, and, therefore, their details are omitted in the figure. Each capacitor 1104 is a memory unit.

For writing information into the memory apparatus 1100, at least one short electrical pulse is applied to selected memory units 1104 through their electrodes 1108 and 1112, so that the selected capacitors 1104 are set to a specific capacitance value. As mentioned early, the capacitance value of each capacitor memory unit 1104 of the array 1102 can be changed between two states or between a plurality of states. Thus, each memory unit 1104 can store binary information or higher modality information, i.e., more than two states. The reading operation can be a process where the elements 1104 in the capacitor array 1102 are connected to an alternating voltage source. Those elements in a high capacitance state induce a higher level of current and those elements in a low capacitance state induce a lower level of current. Such memory apparatuses can be used as non-volatile read only memories, or non-volatile random access memories.

Figure 12:
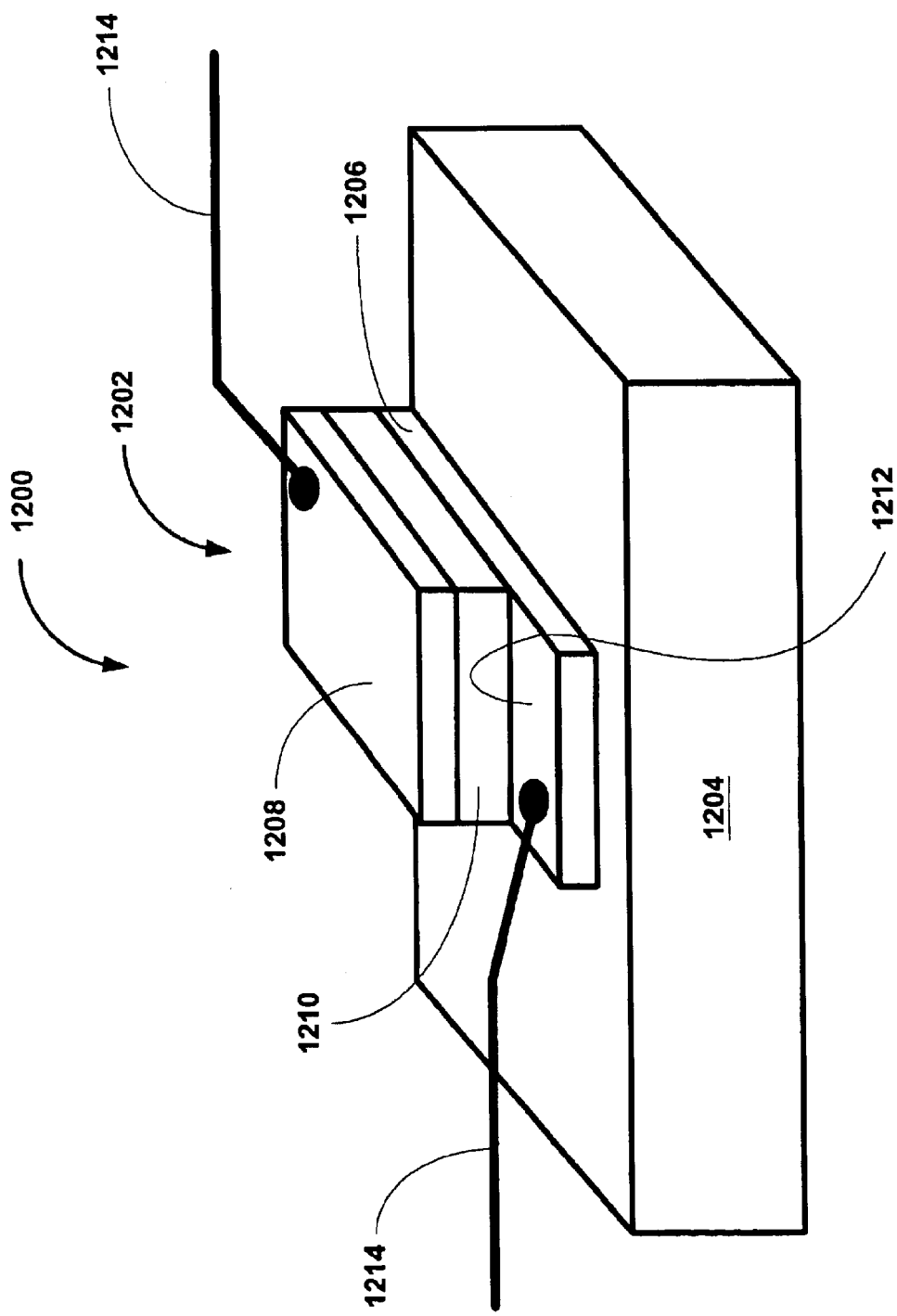
FIG. 12 is a schematic diagram of a variable capacitor made of etched CMR film for circuit application according to an embodiment of the invention.

Another well-known application of non-volatile, variable capacitors of this invention is to make novel electronic circuits, that include at least one non-volatile, variable capacitor of this invention. Referring now to FIG. 12, a part of an integrated circuit, generally 1200, is shown to include a variable, CMR film capacitor 1202 of this invention. The capacitor 1202 is formed on substrate 1204 by deposition and etching and includes a bottom conducting layer 1206, a top conducting layer 1208 and an active CMR dielectric layer 1210 interposed therebetween. The bottom conducting layer 1206 includes a portion 1212 that extends out past the dielectric layer 1210 and top conducting layer 1208 to serve as a bottom electrode, while the top conducting layer 1208 serves as the top electrode. Wires 1214 connect the capacitor 1202 to the rest of the circuit (not shown). Electric pulses applied to the electrodes 1208 and 1212 are used to change the capacitance value of the capacitor 1202. By applying the electrical pulses to the active layer 1210 through the electrodes 1208 and 1212, the capacitor's capacitance can be changed. This type variable capacitor has no moving parts or complex structures and can have a small size, a longer lifetime than presently available variable capacitors, fast operation speed and maintain a desired capacitance value without power consumption.

All references cited herein are incorporated by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

We claim:

1. An electric pulse operated capacitance apparatus comprising two electrodes with an active dielectric interposed therebetween, where a capacitance of the apparatus is set to a desired non-volatile value using at least one electric pulse having a sufficient amplitude and duration to set the capacitance of the apparatus at the desired value.

2. The apparatus of claim 1, wherein the amplitude is above a threshold amplitude and below a breakdown amplitude.

3. The apparatus of claim 1, wherein the electrodes are thin films and the dielectric is a thin film and wherein the active dielectric comprises a material having a perovskite lattice structure.

4. The apparatus of claim 3, wherein the material comprises a colossal magnetoresistive (CMR) material, a giant magnetoresistive (GMR) material, a high temperature superconducting material, or mixtures or combinations thereof.

5. The apparatus of claim 4, wherein the CMR materials are selected from the groups consisting of $Pr_{1-x}Ca_xMnO_3$ (PCMO), $La_{1-x}Ca_xMnO_3$(LCMO), $La_{1-x}Sr_xMnO_3$(LSMO), $Nb_{1-x}Ca_xMnO_3$(NCMO), and mixtures or combinations thereof.

6. The apparatus of claim 1, wherein the electrodes comprise a metal, a metallic oxide, a conductive polymer, or mixtures or combinations thereof.

7. The apparatus of claim 6, wherein the metal is selected from the group consisting of Pt, Ir, Au, Ag, and mixtures or combinations thereof.

8. The apparatus of claim 6, wherein the metal oxide is selected from the group consisting of LaSrCoO3, $Yb_xCuO_{7-x}$, $RuO_2$, $SrRuO_2$, $IrO_2$ and mixtures or combinations thereof.

9. The apparatus of claim 1, further comprising a substrate upon which the two electrodes with the active dielectric interposed therebetween are formed.

10. The apparatus of claim 1, further comprising a substrate having a buffer-layer formed thereon, where the two electrodes with the active dielectric interposed therebetween are formed on top of the buffer-layer.

11. An electric pulse operated variable capacitance storage apparatus comprising two thin filmed electrodes with a thin film active dielectric interposed therebetween, where the apparatus is capable of assuming one of n states via application of at least one electric pulse applied to the apparatus, where n is an integer having a value between 2 and about 12.

12. The apparatus of claim 11, wherein the n has a value between 2 and 8.

13. The apparatus of claim 11, wherein the n has a value between 2 and 4.

14. An electric pulse operated variable capacitance storage apparatus comprising two thin filmed electrodes with a thin filmed active dielectric interposed therebetween, where the apparatus has a first state having a first capacitance and a second state having a second capacitance and where the apparatus transitions between the two states by the application of an electric pulse having a polarity depending on a direction of the transition and an amplitude and duration sufficient to effectuate the transition and where the electrical pulse has a selected polarity, a selected width, a selected peak value and a selected waveform, where the pulse creates an electric field in the dielectric greater than a threshold electric field needed to transition the capacitor between the two states and less than an electric field which damages or destroys the dielectric.

15. The apparatus of claim 14, wherein the selected waveform is selected from the group of waveforms consisting of square, saw-toothed, triangular, sine wave and a cosine wave.

16. The apparatus of claim 14, wherein the selected peak value is between about 0.1 V and about 100 V.

17. The apparatus of claim 14, wherein the selected duration is between about 0.1 ns and about 10 ms.

18. The apparatus of claim 14, wherein the selected duration is between about 1 ns and about 1 $\mu$s.

19. The apparatus of claim 14, wherein the selected polarity is reversed during application of the selected number of pulses.

20. A method for storing and retrieving binary information from a capacitor comprising the steps of:

applying an electric pulse to a capacitor comprising two thin film electrodes with a thin film active dielectric interposed therebetween, where the pulse has an amplitude, a duration, a polarity and a frequency sufficient to adjust a capacitance of the capacitor to a first value corresponding to a logical 0 or to a second value corresponding to a logical 1, and where the amplitude of the pulse induces an electric field in the active dielectric that is greater than a threshold amplitude and below a breakdown amplitude; and reading the capacitance value of the capacitor using a voltage source having an amplitude below the threshold amplitude.

21. The method of claim 20, wherein a 0→1 pulse has a first polarity that transitions the capacitor to its second state corresponding to a logical 1 or wherein a 1→0 pulse has a second and oppose polarity that transitions the capacitor to it first state corresponding to a logical 0, where the amplitude and duration of the pulses are the same or different.

22. The method of claim 21, wherein the pulses have the same amplitude and the same or different duration.

23. The method of claim 21, wherein the pulses have the same duration and the same or different amplitude.

24. The method of claim 21, wherein the pulses have the same amplitude and duration.

25. The method of claim 20, further comprising the step of:

applying at least one electric pulse to the capacitor, where the pulse has an amplitude, a duration, a polarity and a frequency sufficient to set a capacitance of the capacitor to a start capacitance value.

26. The method of claim 21, wherein the capacitor is one of a plurality of identical capacitors comprising a read only memory or a random access memory.

27. A method for operating a non-volatile, variable capacitor comprising the steps of:

applying at least one short electric pulse to a capacitor comprising two thin filmed electrodes with a thin filmed active dielectric interposed therebetween, where the pulses have an amplitude, a duration, a polarity and a frequency sufficient to adjust a capacitance of the capacitor to a target capacitance value or level and where the amplitude of the pulse induces an electric field in the active dielectric that is greater than a threshold amplitude and below a breakdown amplitude; and reading the capacitance value of the capacitor using a voltage source having an amplitude below the threshold amplitude.

28. The method of claim 27, further comprising the step of:

applying at least one electric pulse to the capacitor, where the pulse has an amplitude, a duration, a polarity and a frequency sufficient to set a capacitance of the capacitor to a start capacitance value.

29. The method of claim 27, wherein the capacitor is a component in an integrated circuit and the method further comprises the step of:

determining a measured output of the circuit;

comparing the measured output of the circuit to a desired circuit output;

adjusting the capacitance of the capacitor to a new capacitance value using at least one electric pulse to the capacitor, where the pulse has an amplitude, a duration, a polarity and a frequency sufficient to set the capacitance of the capacitor to the new capacitance value, and repeating the determining step, the comparing step and the adjusting until a difference between the measured circuit output and the desired circuit output is a minimum or a maximum.

30. The method of claim 29, further comprising the step of:

applying at least one electric pulse to the capacitor, where the pulse has an amplitude, a duration, a polarity and a frequency sufficient to set a capacitance of the capacitor to a start capacitance value.

* * * * *